United States Patent
Hatsuda et al.

(10) Patent No.: US 10,431,277 B2
(45) Date of Patent: Oct. 1, 2019

(54) MEMORY DEVICE

(71) Applicant: TOSHIBA MEMORY CORPORATION, Minato-ku, Tokyo (JP)

(72) Inventors: Kosuke Hatsuda, Tokyo (JP); Yorinobu Fujino, Hachioji Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

(21) Appl. No.: 15/703,340

(22) Filed: Sep. 13, 2017

(65) Prior Publication Data

US 2018/0277186 A1 Sep. 27, 2018

(30) Foreign Application Priority Data

Mar. 24, 2017 (JP) .................................. 2017-059602

(51) Int. Cl.
  *G11C 11/16* (2006.01)
  *G11C 13/00* (2006.01)

(52) U.S. Cl.
  CPC ...... *G11C 11/1655* (2013.01); *G11C 11/1659* (2013.01); *G11C 11/1673* (2013.01); *G11C 11/1675* (2013.01); *G11C 11/1693* (2013.01); *G11C 13/004* (2013.01); *G11C 13/0026* (2013.01); *G11C 13/0061* (2013.01); *G11C 2013/0042* (2013.01); *G11C 2013/0057* (2013.01); *G11C 2207/002* (2013.01)

(58) Field of Classification Search
  CPC .......................... G11C 11/1655; G11C 11/1659
  USPC ......................................................... 365/158
  See application file for complete search history.

(56) References Cited

U.S. PATENT DOCUMENTS

| 6,366,501 B1 | 4/2002 | Thurgate et al. |
| 7,876,604 B2 * | 1/2011 | Zheng ................. G11C 11/1673 365/158 |
| 8,923,041 B2 | 12/2014 | Andre et al. |
| 2006/0092734 A1 | 5/2006 | Tsuchida et al. |
| 2009/0323403 A1 * | 12/2009 | Chen ................... G11C 11/1673 365/158 |
| 2011/0026317 A1 * | 2/2011 | Zhu ..................... G11C 11/1659 365/158 |
| 2011/0205788 A1 * | 8/2011 | Reed ..................... B82Y 25/00 365/158 |

(Continued)

FOREIGN PATENT DOCUMENTS

| JP | 2006127672 A | 5/2006 |
| JP | 2013251035 A | 12/2013 |

(Continued)

*Primary Examiner* — Hoai V Ho
*Assistant Examiner* — Muna A Techane
(74) *Attorney, Agent, or Firm* — Holtz, Holtz & Volek PC

(57) ABSTRACT

According to one embodiment, a memory device includes a memory cell; and a first circuit configured to perform first read for the memory cell and generate a first voltage, write first data to the memory cell that has undergone the first read, perform second read for the memory cell to which the first data is written and generate a second voltage, and determine data stored in the memory cell at the time of the first read based on the first voltage and the second voltage, wherein when writing the first data, the first circuit electrically sets a generation unit configured to generate the second voltage in a floating state.

23 Claims, 29 Drawing Sheets

(56) References Cited

U.S. PATENT DOCUMENTS

| | | | |
|---|---|---|---|
| 2013/0128657 A1* | 5/2013 | Alam | G11C 11/1673 365/158 |
| 2013/0272060 A1* | 10/2013 | Andre | G11C 11/1673 365/158 |
| 2013/0322161 A1 | 12/2013 | Noguchi et al. | |
| 2014/0016404 A1 | 1/2014 | Kim et al. | |
| 2016/0027489 A1 | 1/2016 | Alam et al. | |
| 2016/0365140 A1 | 12/2016 | Azuma et al. | |
| 2017/0301384 A1* | 10/2017 | Andre | G11C 11/1673 |

FOREIGN PATENT DOCUMENTS

| | | |
|---|---|---|
| JP | 2017004587 A | 1/2017 |
| TW | 495755 B | 7/2002 |
| TW | 201403597 A | 1/2014 |

* cited by examiner

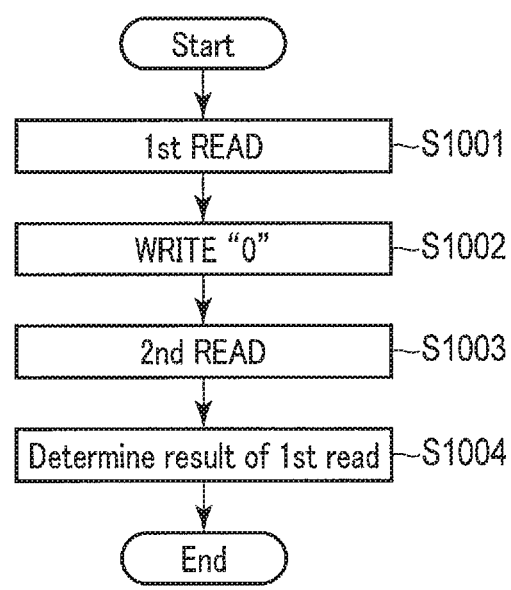
F I G. 7

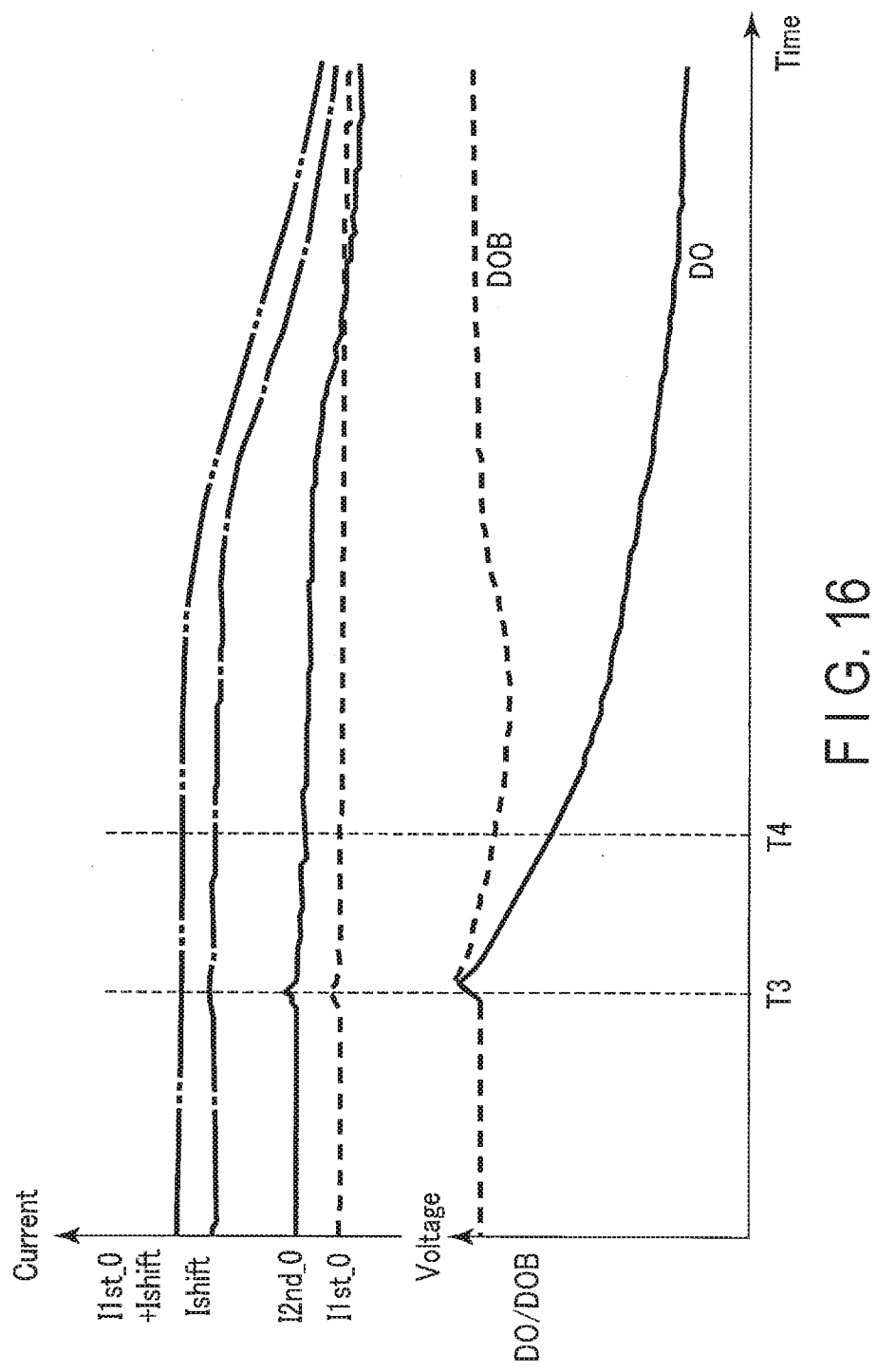
F I G. 16

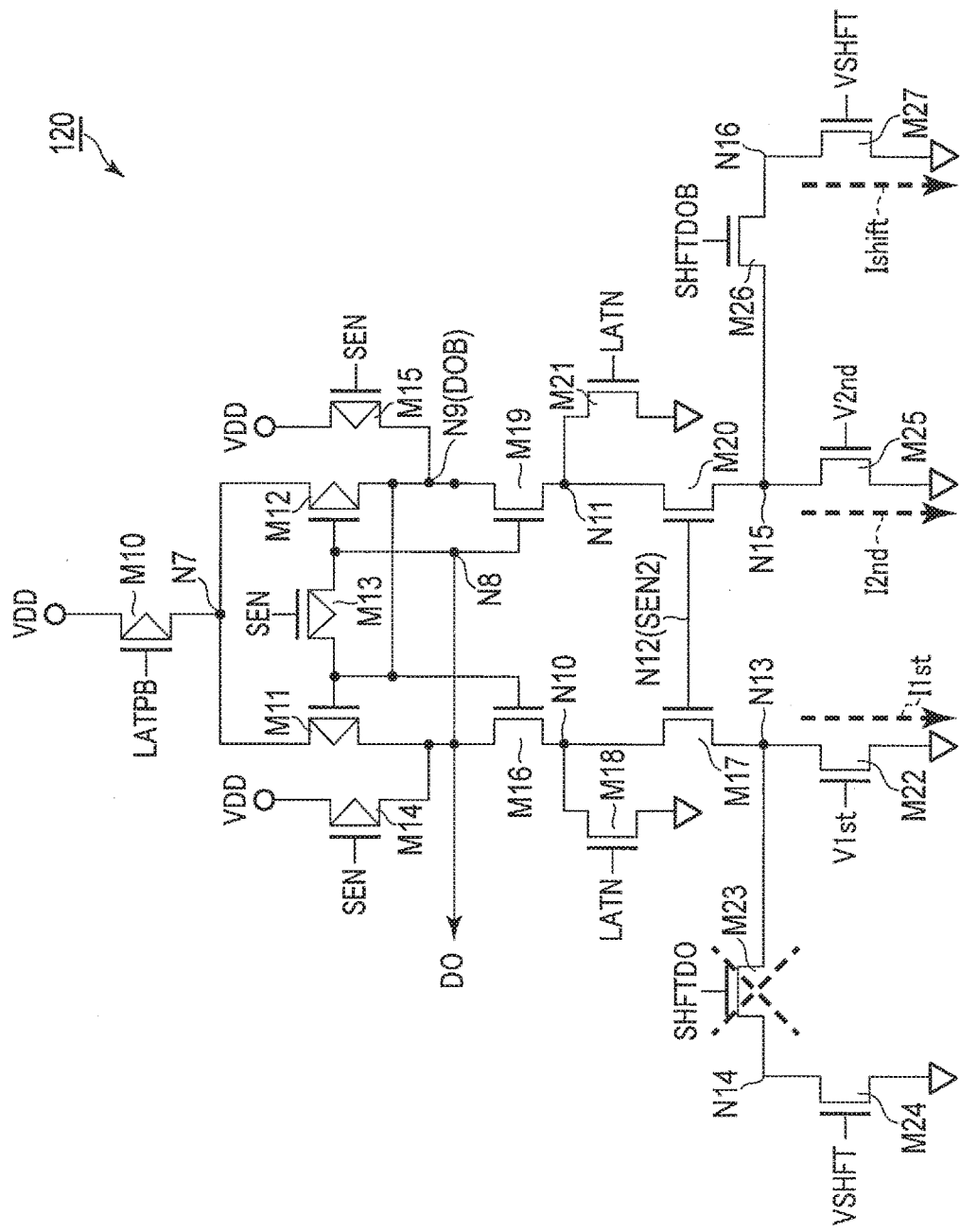
F I G. 18

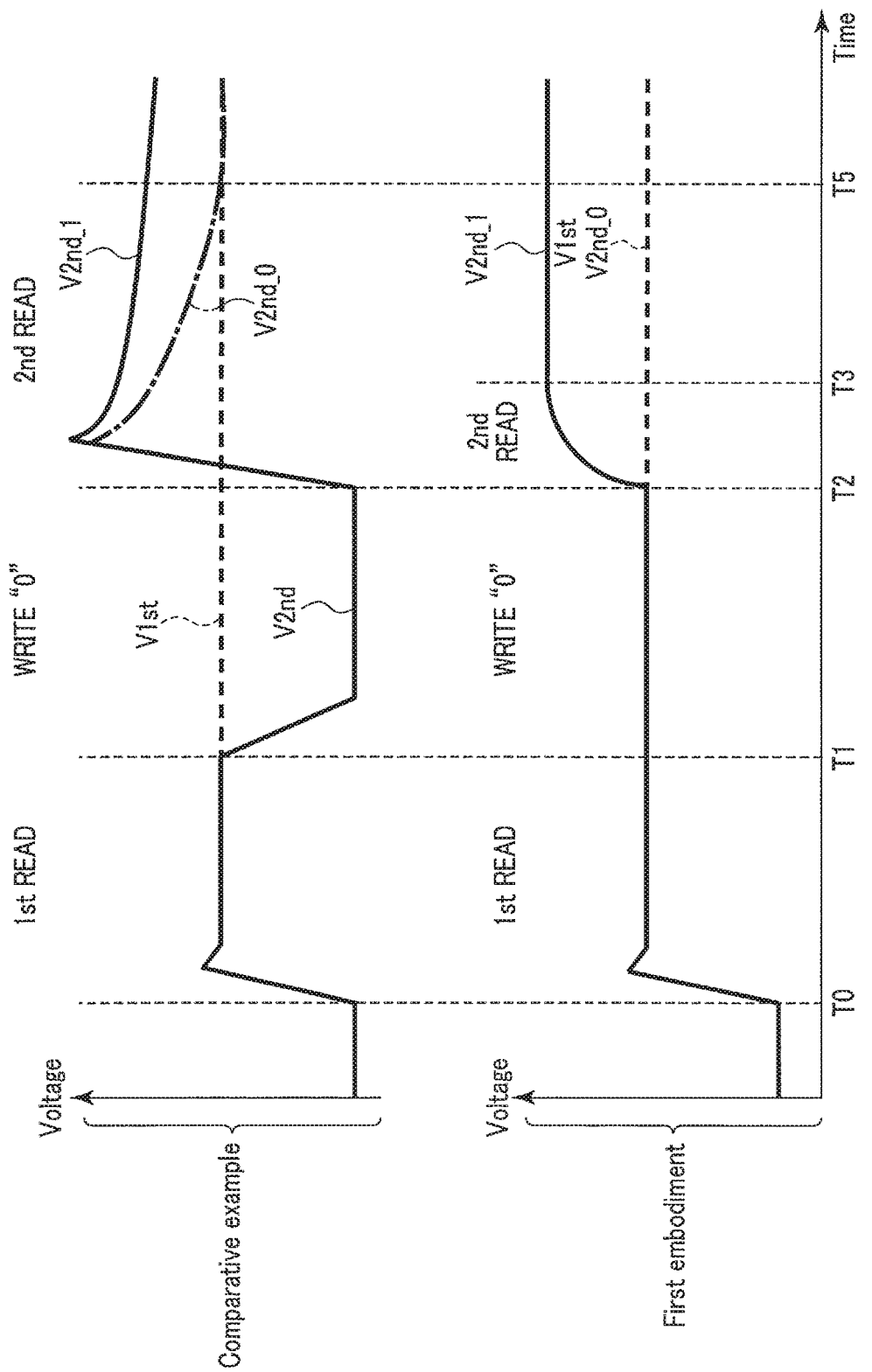
F I G. 20

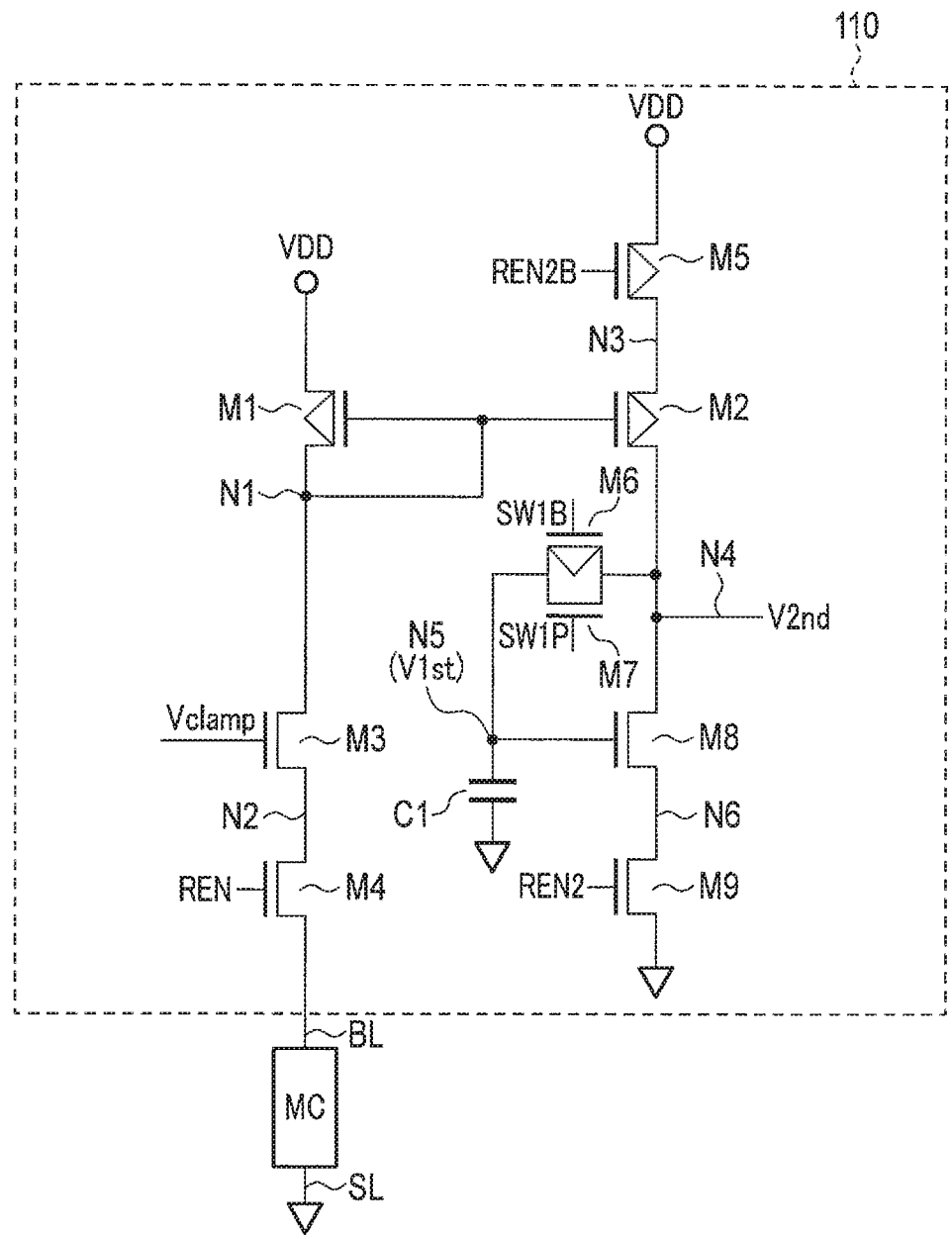
F I G. 21

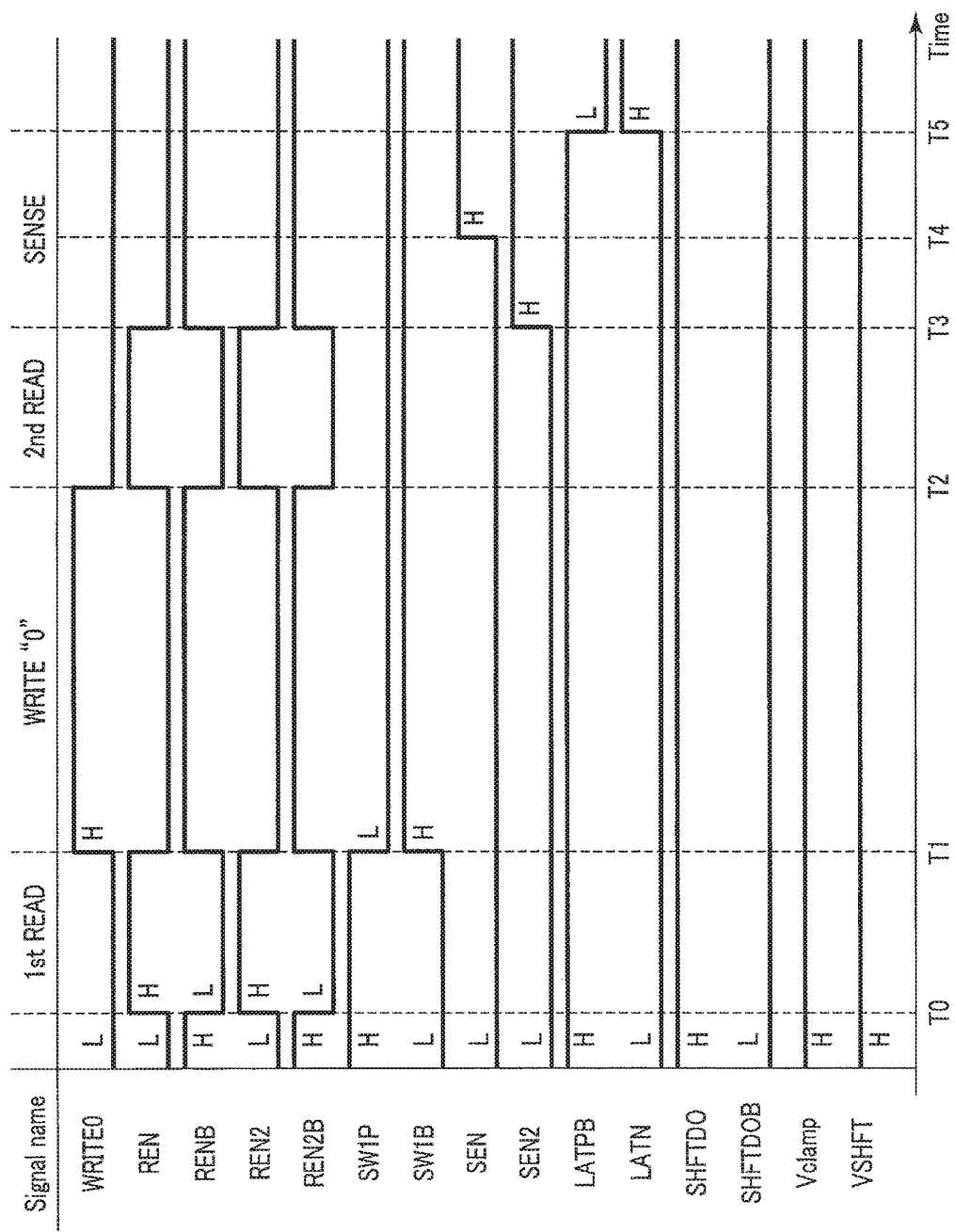
F I G. 22

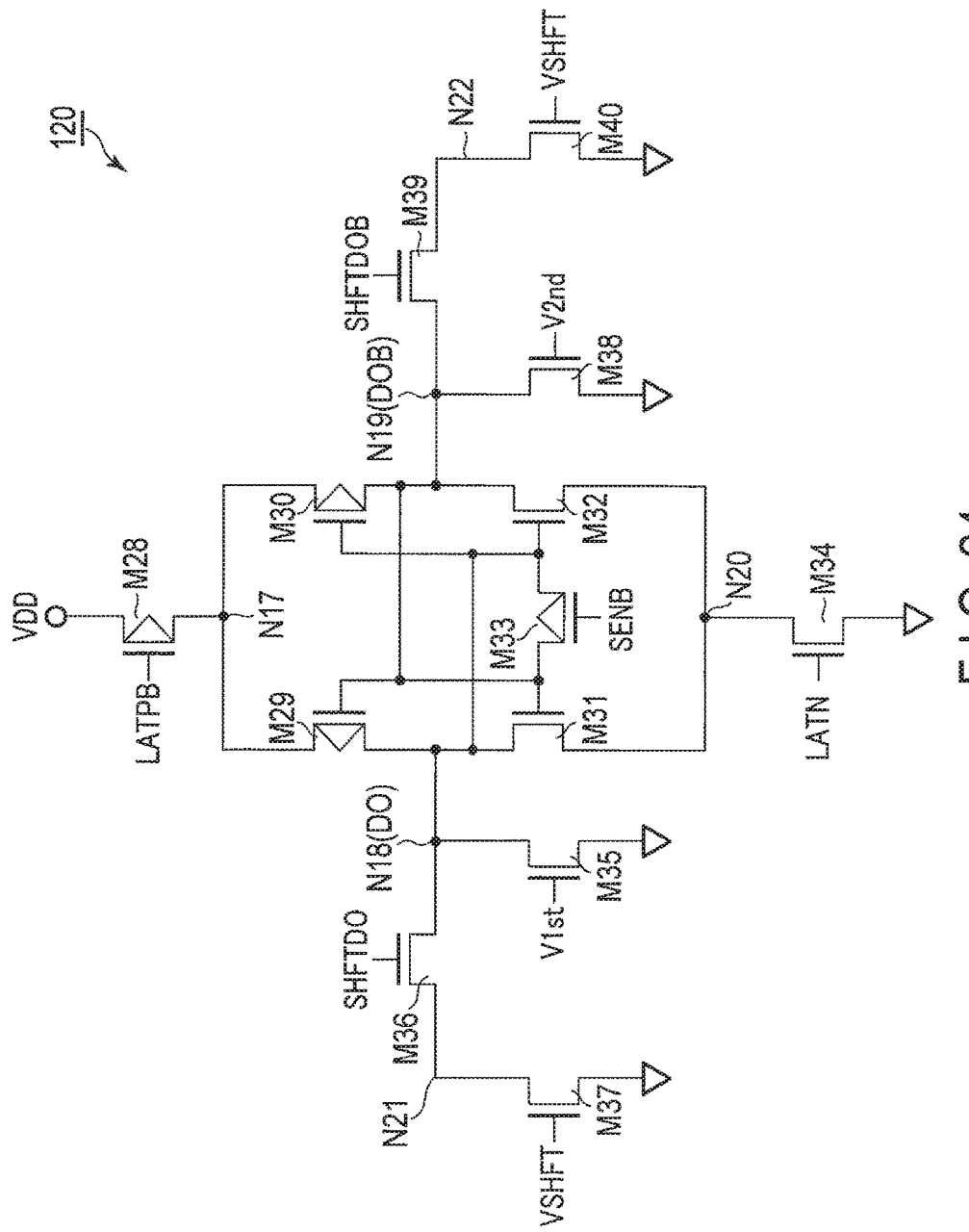
F I G. 24

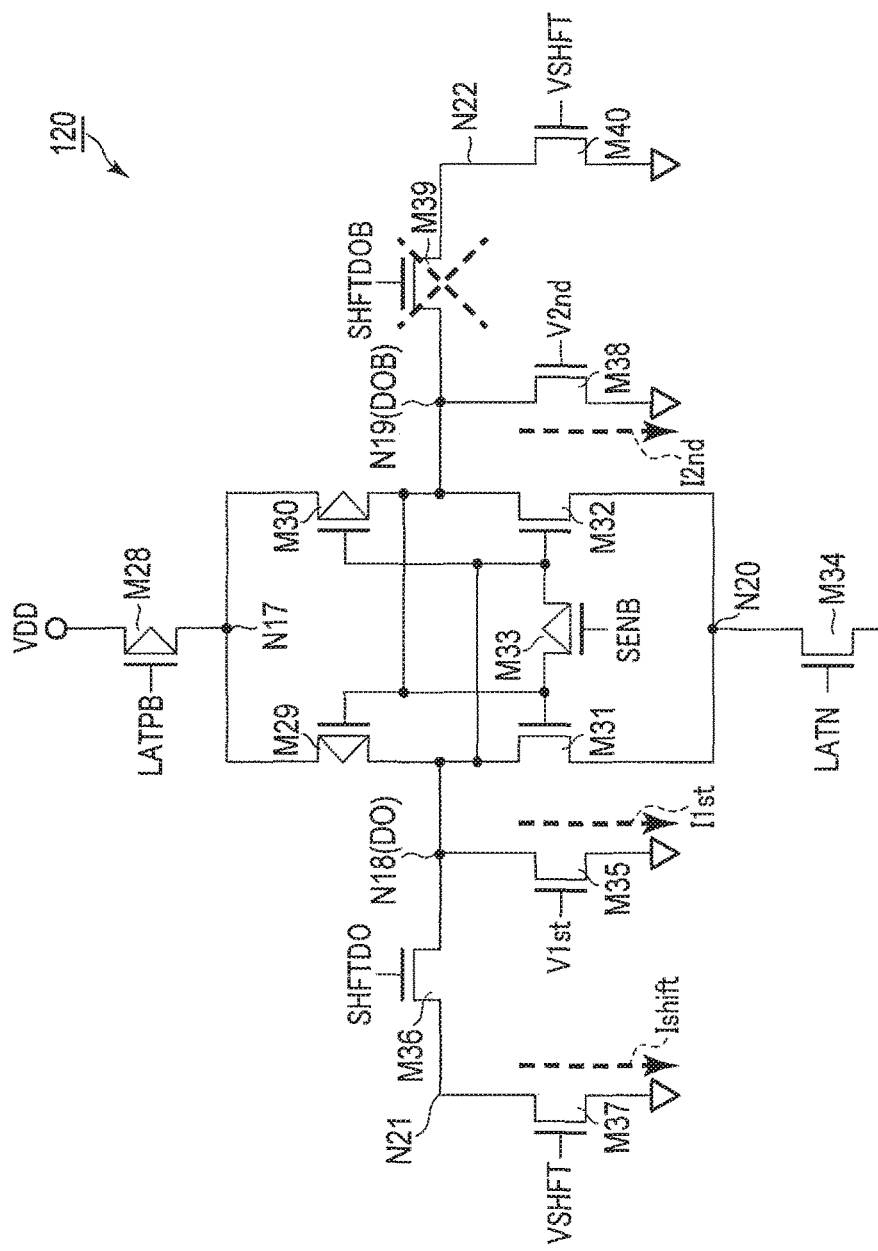
F I G. 26

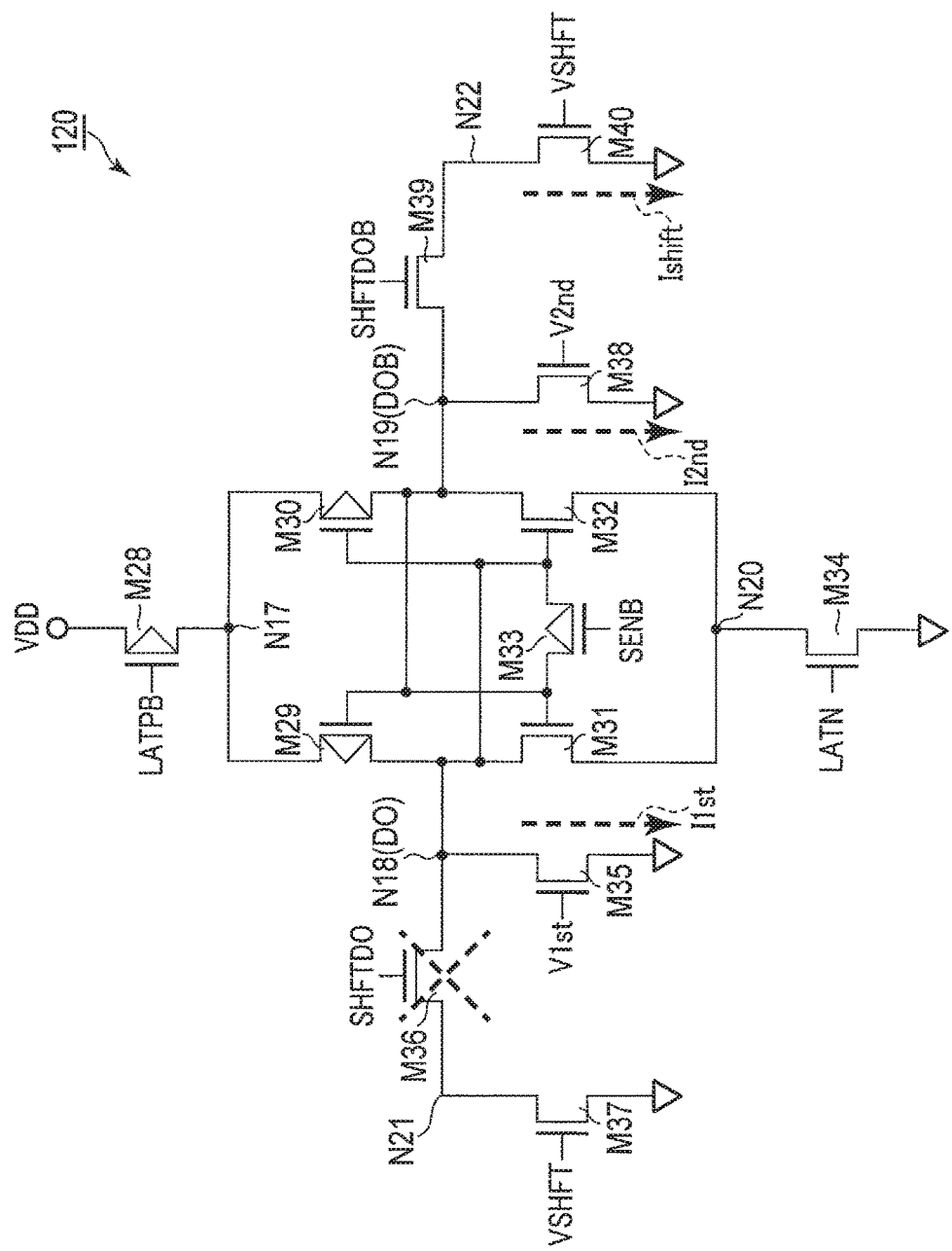
F I G. 28

US 10,431,277 B2

MEMORY DEVICE

CROSS REFERENCE TO RELATED APPLICATIONS

This application is based upon and claims the benefit of priority from prior Japanese Patent Application No. 2017-059602, filed Mar. 24, 2017; the entire contents of which are incorporated herein by reference.

FIELD

Embodiments described herein relate generally to a memory device.

BACKGROUND

An MRAM (Magnetoresistive Random Access Memory) is a memory device that uses a magnetic element with a magnetoresistive effect as a memory cell configured to store information. The MRAM has received attention as a next generation memory device featuring a high speed operation, large capacity, and nonvolatility. The MRAM is under research and development as a replacement for a volatile memory such as a DRAM (Dynamic Random Access Memory) or an SRAM (Static Random Access Memory). In this case, the MRAM is preferably operated in the same specifications as the DRAM and the SRAM from the viewpoint of keeping the development cost low and implementing smooth replacement.

BRIEF DESCRIPTION OF THE DRAWINGS

FIG. 7 is a flowchart showing the read operation of the memory system including the memory device according to the first embodiment;

FIG. 16 is a timing chart showing currents and voltages generated in the sense amplifier in a case in which the memory cell stores "0" data at the time of the first read operation;

FIG. 18 is a circuit diagram showing the operation of the sense amplifier of the memory device according to the first embodiment in the determination operation;

FIG. 20 is a timing chart showing the waveform of a voltage at the time of the read operation of the memory system according to the first embodiment and the waveform of a voltage at the time of the read operation of the memory system according to the comparative example of the first embodiment;

FIG. 21 is a circuit diagram showing the preamplifier of a memory device according to the second embodiment;

FIG. 22 is a timing chart of the read operation of a memory system according to the second embodiment;

FIG. 24 is a circuit diagram showing the sense amplifier of a memory device according to the third embodiment;

FIG. 26 is a circuit diagram showing the operation of the sense amplifier of the memory device according to the third embodiment in a determination operation;

FIG. 28 is a circuit diagram showing the operation of the sense amplifier of the memory device according to the third embodiment in a determination operation;

DETAILED DESCRIPTION

Figure 1:
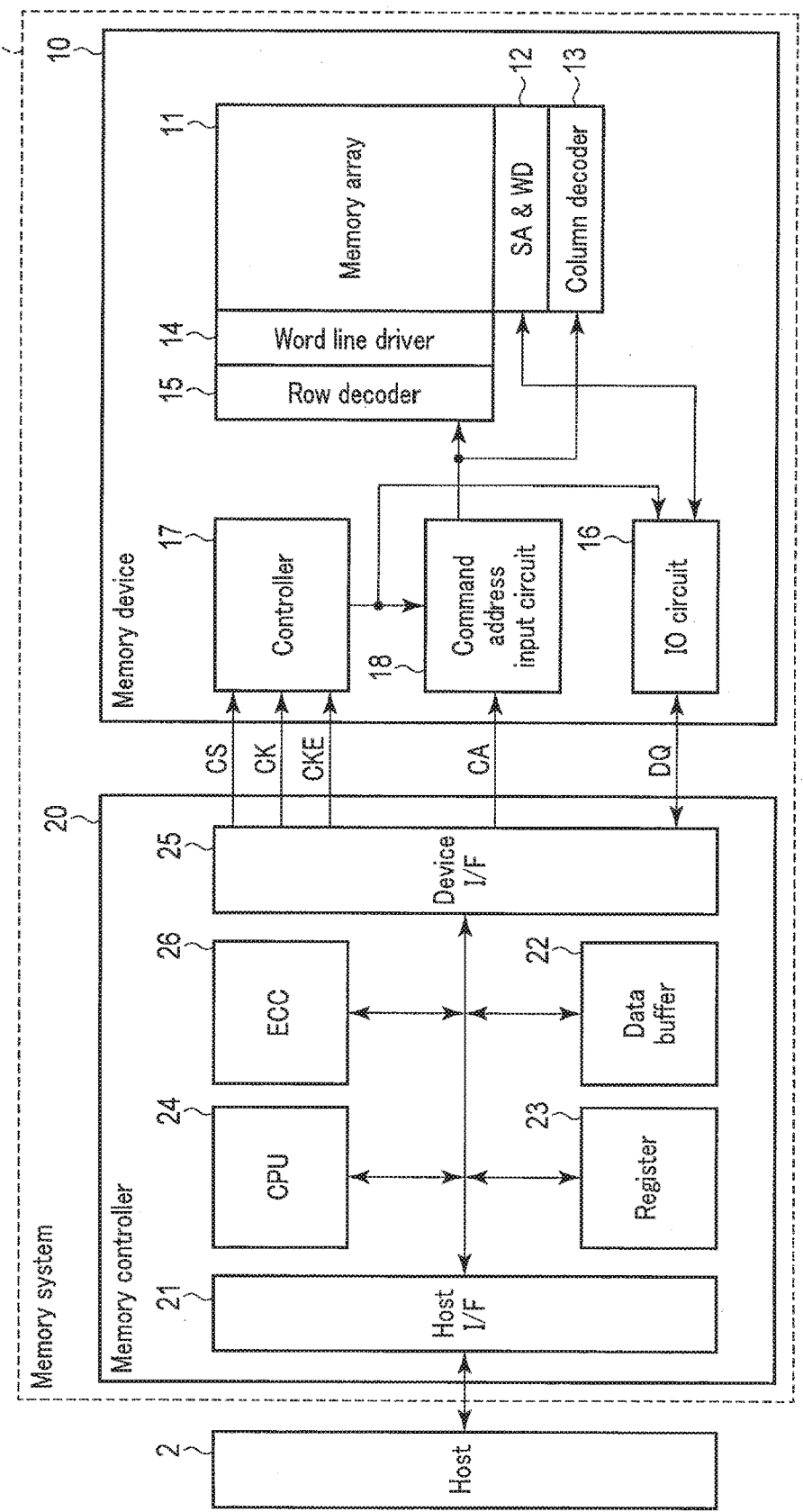
FIG. 1 is a block diagram showing a memory system including a memory device according to the first embodiment.

In general, according to one embodiment, a memory device includes a memory cell; and a first circuit configured to perform first read for the memory cell and generate a first voltage, write first data to the memory cell that has undergone the first read, perform second read for the memory cell to which the first data is written and generate a second voltage, and determine data stored in the memory cell at the time of the first read based on the first voltage and the second voltage, wherein when writing the first data, the first circuit electrically sets a generation unit configured to generate the second voltage in a floating state.

Embodiments will now be described with reference to the accompanying drawings. Note that in the following explanation, the same reference numerals denote constituent elements having almost the same functions and arrangements, and a repetitive description will be made only when necessary. The embodiments to be described below merely exemplify devices and methods for embodying the technical concepts of the embodiments, and the technical concepts of the embodiments do not limit the materials, shapes, structures, layouts, and the like of the components to those to be described below. The technical concepts of the embodiments allow various changes and modifications to be made in the appended claims.

Each functional block can be implemented as one of hardware and computer software or a combination thereof. For this reason, each block will be described from the viewpoint of its function to clearly show that the block is implemented by either of them. Whether the function is executed as hardware or software depends on a detailed embodiment or a design restriction imparted to the whole system. Those skilled in the art can implement these functions by various methods for each detailed embodiment. However, deciding the implementation is incorporated in the present invention.

A case in which an MRAM is applied to a memory array will be described in the following embodiments.

<1> First Embodiment

<1-1> Arrangement
<1-1-1> Arrangement of Memory System

The basic arrangement of a memory system 1 according to the first embodiment will schematically be described with reference to FIG. 1. The memory system 1 includes a memory device 10 and a memory controller 20.

<1-1-2> Arrangement of Memory Controller

The memory controller 20 receives an instruction from a host (external device) 2 such as a personal computer, and reads data from the memory device 10 or writes data to the memory device 10.

The memory controller 20 includes a host interface (I/F) 21, a data buffer 22, a register 23, a CPU (Central Processing Unit) 24, a device interface (I/F) 25, and an ECC (Error Correcting Code) circuit 26.

The host interface 21 is connected to the host 2. Data transmission/reception or the like is performed between the host 2 and the memory system 1 via the host interface 21.

The data buffer 22 is connected to the host interface 21. The data buffer 22 receives data transmitted from the host 2 to the memory system 1 via the host interface 21 and temporarily stores the data. The data buffer 22 also temporarily stores data to be transmitted from the memory system 1 to the host 2 via the host interface 21. The data buffer 22 can be a volatile memory or a nonvolatile memory.

The register 23 is, for example, a volatile memory, and stores setting information, a command, a status, or the like executed by the CPU 24. The register 23 can be a volatile memory or a nonvolatile memory.

The CPU 24 controls the operation of the entire memory system 1. The CPU 24, for example, executes predetermined processing for the memory device 10 in accordance with a command received from the host 2.

The device interface 25 transmits/receives various kinds of signals between the memory controller 20 and the memory device 10.

The ECC circuit 26 receives, via the data buffer 22, write data received from the host 2. The ECC circuit 26 adds an error correcting code to the write data. The ECC circuit 26 supplies the write data with the added error correcting code to, for example, the data buffer 22 or the device interface 25.

In addition, the ECC circuit 26 receives, via the device interface 25, data supplied from the memory device 10. The data is data stored in a memory cell of a memory array 11. The FCC circuit 26 determines whether an error exists in the data received from the memory device 10. Upon determining that an error exists in the received data, the ECC circuit 26 performs error correction processing for the received data using an error correcting code. The ECC circuit 26 then supplies the data that has undergone the error correction processing to, for example, the data buffer 22 or the device interface 25.

<1-1-3> Arrangement of Memory Device

The memory device 10 according to the first embodiment includes the memory array 11, a sense amplifier & write driver 12, a column decoder 13, a word line driver 14, a row decoder 15, an IO circuit 16, a controller 17, and a command address input circuit 18.

Various kinds of external control signals, for example, a chip select signal CS, a clock signal CK, a clock enable signal CKE, and a command address signal CA are input from the memory controller 20 to the command address input circuit 18. The command address input circuit 18 transfers the command address signal CA to the controller 17.

The controller 17 identifies commands and addresses. The controller 17 controls the memory device 10.

The memory array 11 is an MRAM in which a plurality of memory cells MC are two-dimensionally arranged in a matrix. Each memory cell MC includes an MTJ (Magnetic Tunnel Junction) element 30 (not shown) and a select transistor 31 (not shown). The MTJ element 30 is a magnetic tunnel junction element capable of storing data according to a change in the resistance state and rewriting the data by a current. The select transistor 31 is provided in correspondence with each MTJ element 30 and configured to be rendered conductive when supplying a current to the corresponding MTJ element 30. Note that the MTJ element may be referred to as a resistance change element.

A plurality of word lines WL extend in the row direction, and a plurality of bit lines BL extend in the column direction. The word lines WL and the bit lines EL are wired to cross each other. Two adjacent bit lines EL form a pair, and a memory cell MC is provided in correspondence with the intersection between a word line WL and a bit line pair (to the referred to as the bit line BL and a source line SL for the descriptive convenience in this embodiment). The MTJ element 30 and the select transistor 31 of each memory cell MC are connected in series between the bit line EL and the source line EL (in a bit line pair). The gate of the select transistor 31 is connected to the word line WL.

The word line driver 14 is arranged at least along one side of the memory array 11. The word line driver 14 is configured to apply a voltage to the word line WL in data read or data write.

The row decoder 15 decodes the address of the command address signal CA supplied from the command address input circuit 18. More specifically, the row decoder 15 supplies the decoded row address to the word line driver 14. Accordingly, the word line driver 14 can apply a voltage to the selected word line WL.

The column decoder 13 decodes the address of the command address signal CA supplied from the command address input circuit 18. The column decoder 13 supplies the decoded column address to the sense amplifier & write driver 12.

The sense amplifier & write driver 12 includes a sense amplifier and a write driver. The sense amplifier & write driver 12 is arranged at least along one side of the memory array 11. The sense amplifier is connected to the bit line BL via a global bit line GBL and detects a current flowing to the memory cell MC connected to the selected word line WL, thereby reading data stored in the memory cell MC. The write driver is connected to the bit line BL via the global bit line GBL or to the source line SL via a global source line GSL. When writing data to the selected memory cell MC, the write driver supplies a current to the selected memory cell MC connected to the selected word line WL.

In addition, the sense amplifier & write driver 12 includes a page buffer (not shown). The page buffer is, for example, a volatile memory and stores data read by the sense amplifier or write data transferred via the IO circuit 16.

Data transmission/reception between the sense amplifier & write driver 12 and a data line DQ is done via the IO circuit 16.

<1-1-4> Memory Array

Figure 2:
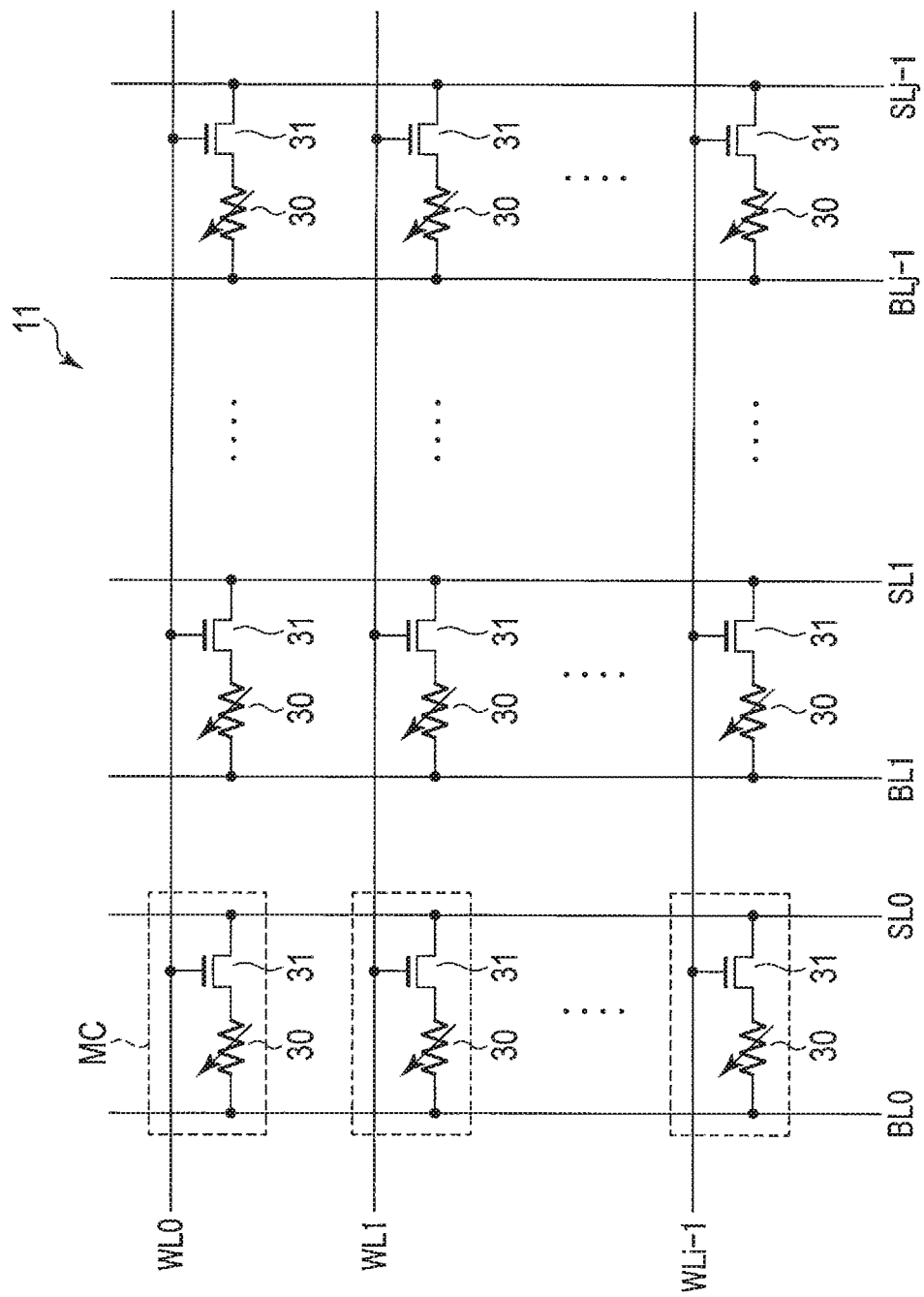
FIG. 2 is a circuit diagram showing the memory array of the memory device according to the first embodiment.

A detailed arrangement of the memory array of the memory device according to the first embodiment will be described next with reference to FIG. 2. As described above, the memory array 11 is formed by arranging the plurality of memory cells MC in a matrix. More specifically, the memory array 11 is provided with a plurality of word lines WL0 to WLi−1 (i: an integer of 2 or more), a plurality of bit lines BL0 to BLj−1, and a plurality of source lines SL0 to SLj−1 (j: an integer of 2 or more).

The memory cell MC is formed by the MTJ element 30 and the select transistor 31. The select transistor 31 is formed from, for example, an N-channel MOSFET (Metal Oxide Silicon Field Effect Transistor).

One terminal of the MTJ element 30 is connected to the bit line BL, and the other terminal is connected to the drain of the select transistor 31. The gate of the select transistor 31 is connected to the word line WL, and the source is connected to the source line SL.

<1-1-5> Memory Cell

The memory cell of the memory device according to the first embodiment will schematically be described next with reference to FIG. 3.

Figure 3:
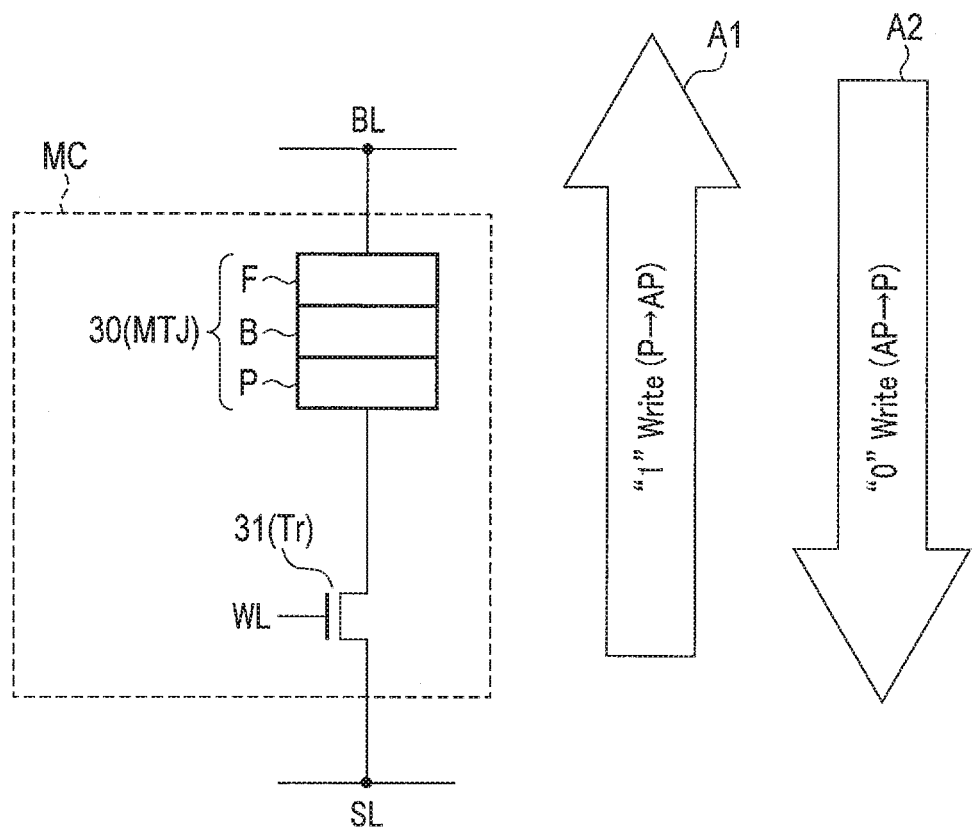
FIG. 3 is a view showing the basic arrangement of a memory cell of the memory device according to the first embodiment.

As shown in FIG. 3, the MTJ element 30 using a TMR (Tunneling MagnetoResistive) effect has a stacked structure including two ferromagnetic layers F and P and a nonmagnetic layer (tunnel insulating film) B sandwiched between them, and stores digital data based on a change in the magnetoresistance by a spin polarization tunneling effect. The MTJ element 30 can obtain a low resistance state and a high resistance state according to the magnetic alignment of the two ferromagnetic layers F and P. For example, when the low resistance state is defined as "0" data, and the high resistance state is defined as "1" data, 1-bit data can be recorded in the MTJ element 30. The low resistance state may be defined as "1" data, and the high resistance state may be defined as "0" data, as a matter of course.

For example, the MTJ element 30 is formed by sequentially stacking the fixed layer (pinned layer) P, the tunnel barrier layer B, and the recording layer (free layer) F. The pinned layer P is a layer in which the direction of magnetic alignment is fixed. In the free layer F, the direction of magnetic alignment can change. The free layer F stores data depending on the direction of magnetization. The pinned layer P and the free layer F are made of a ferromagnetic material, and the tunnel barrier layer B is made of an insulating film.

More specifically, for example, cobalt iron boron (CoFeB) or on boride (FeB) may be used for the free layer F. For example, cobalt platinum (CoPt), cobalt nickel (CoNi), or cobalt palladium (CoPd) may be used for the pinned layer P. The tunnel barrier layer B is made of a nonmagnetic material, and a nonmagnetic metal, a nonmagnetic semiconductor, or an insulating material can be used. For example, magnesium oxide (MgO) or aluminum oxide ($Al_2O_3$) may be used for the tunnel barrier layer B.

When a current is supplied in the direction of an arrow A1 at the time of write, the direction of magnetization in the free layer F is set in an antiparallel state (AP state) with respect to that in the pinned layer P, and the high resistance state ("1" data) is obtained. This write operation can be referred to as a "1" write operation. When a current is supplied in the direction of an arrow A2 at the time of write, the direction of magnetization in the pinned layer P and that in the free layer F are set in a parallel state (P state), and the low resistance state ("0" data) is obtained. This write operation can be referred to as a "0" write operation. In this way, the MTJ element can write different data depending on the direction to supply the current.

<1-1-6> Sense Amplifier & Write Driver

The sense amplifier & write driver 12 of the memory device according to the first embodiment will be described with reference to FIG. 4.

Figure 4:
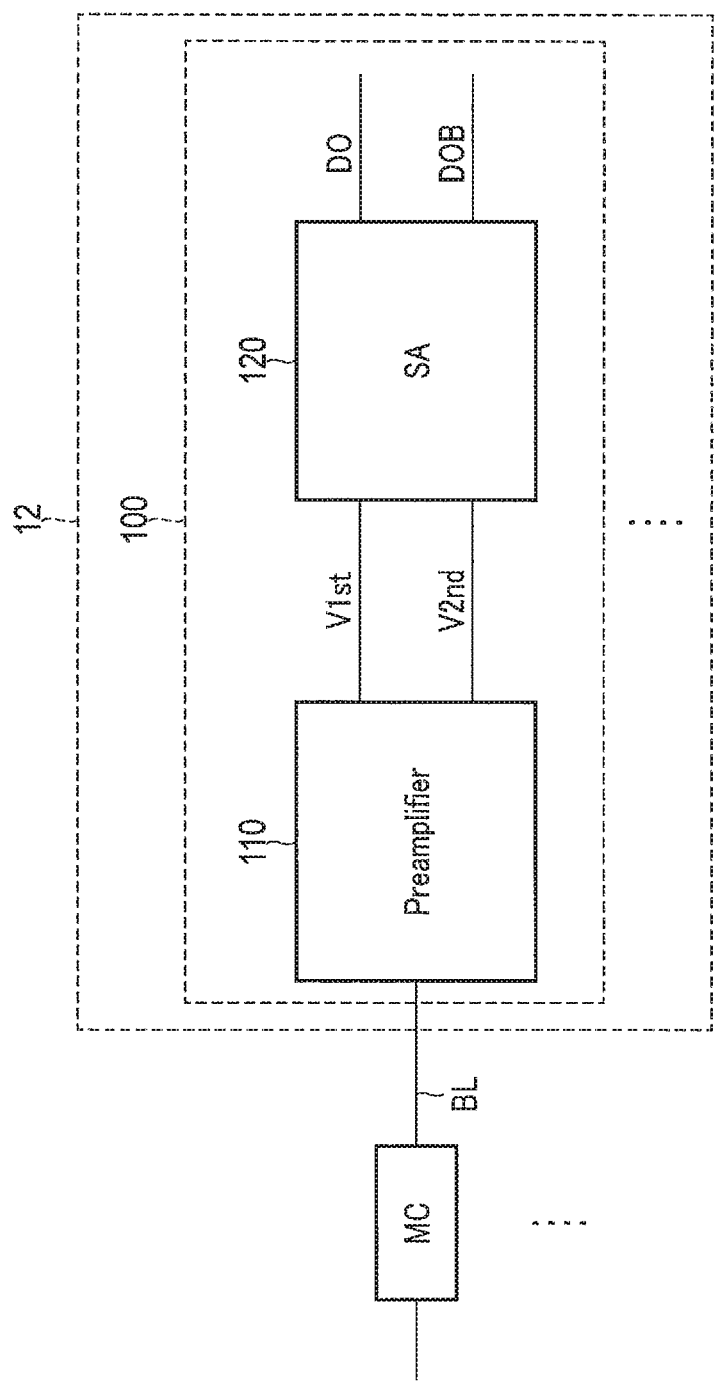
FIG. 4 is a block diagram showing a sense amplifier & write driver of the memory device according to the first embodiment.

As shown in FIG. 4, the sense amplifier & write driver 12 includes a plurality of sense circuits 100. The plurality of sense circuits 100 are provided in correspondence with the bit lines (global bit lines), respectively. Each of the plurality of sense circuits 100 includes a preamplifier 110 and a sense amplifier (SA) 120.

The preamplifier 110 supplies a current (cell current) to the memory cell MC via the bit line, and stores voltages V1st and V2nd based on the cell current.

The sense amplifier 120 determines data (DO or DOB) based on the voltages V1st and V2nd stored in the preamplifier 110.

<1-1-6-1> Arrangement of Preamplifier

The arrangement of the preamplifier 110 of the memory device according to the first embodiment will be described next with reference to FIG. 5.

Figure 5:
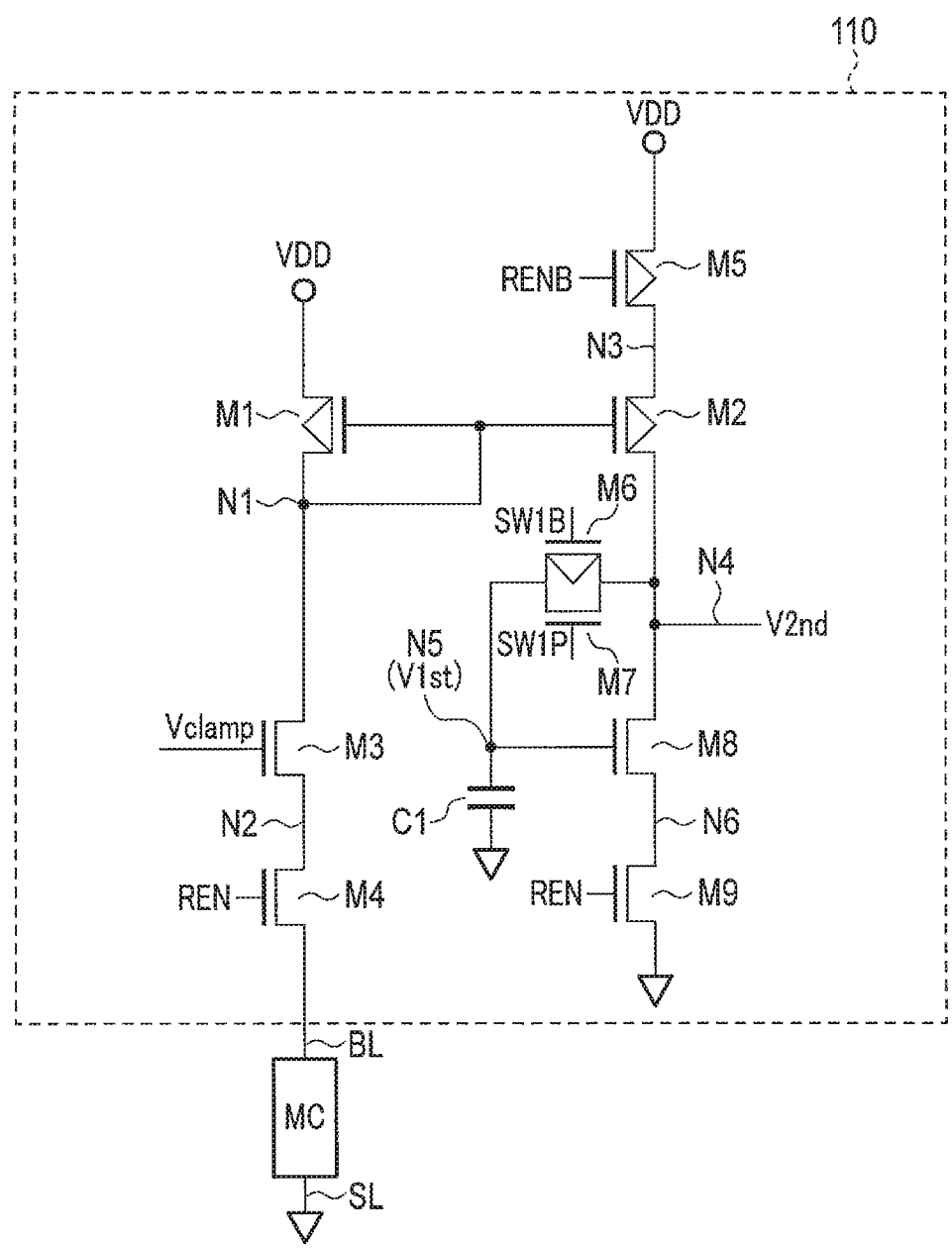
FIG. 5 is a circuit diagram showing the preamplifier of the memory device according to the first embodiment.

As shown in FIG. 5, the preamplifier 110 includes PMOS transistors M1, M2, M5, and M6, NMOS transistors M3, M4, M7, M8, and M9, and a capacitor C1.

A power supply voltage VDD is applied to one terminal of the transistor M1, and the other terminal and the gate electrode are connected to a node N1.

One terminal of the transistor M2 is connected to a node N3, the other terminal is connected to a node N4, and the gate electrode is connected to the node N1.

The transistor M1 and the transistor M2 function as a current mirror.

One terminal of the transistor M3 is connected to the node N1, the other terminal is connected to a node N2, and a signal Vclamp is supplied to the gate electrode.

One terminal of the transistor M4 is connected to the node N2, the other terminal is connected to the bit line (global bit line), and a signal REN is supplied to the gate electrode.

The power supply voltage VDD is applied to one terminal of the transistor M5, the other terminal is connected to the node N3, and a signal RENB is supplied to the gate electrode.

One terminal of the transistor M6 is connected to the node N4, the other terminal is connected to a node N5, and a signal SW1B is supplied to the gate electrode.

One terminal of the transistor M7 is connected to the node N4, the other terminal is connected to the node N5, and a signal SN1P is supplied to the gate electrode.

The transistor M6 and the transistor M7 function as one switch.

One terminal of the transistor M8 is connected to the node N4, the other terminal is connected to a node N6, and the gate electrode is connected to the node N5.

One terminal of the transistor M9 is connected to the node N6, a ground voltage VSS is applied to the other terminal, and the signal REN is supplied to the gate electrode.

One terminal of the capacitor C1 is connected to the node N5, and the ground voltage VSS is applied to the other terminal.

The potential of the node N4 is supplied to the sense amplifier 120 as V2nd. The transistor M8 and the node N4 can be considered as a V2nd generation unit.

The potential of the node M5 is supplied to the sense amplifier 120 as V1st. The transistors M6, M7, and M8, the capacitor C1, and the node N5 can be considered as a V1st generation unit.

The operation of the preamplifier 110 will be described later.

<1-1-6-2> Arrangement of Sense Amplifier

The arrangement of the sense amplifier 120 of the memory device according to the first embodiment will be described next with reference to FIG. 6.

Figure 6:
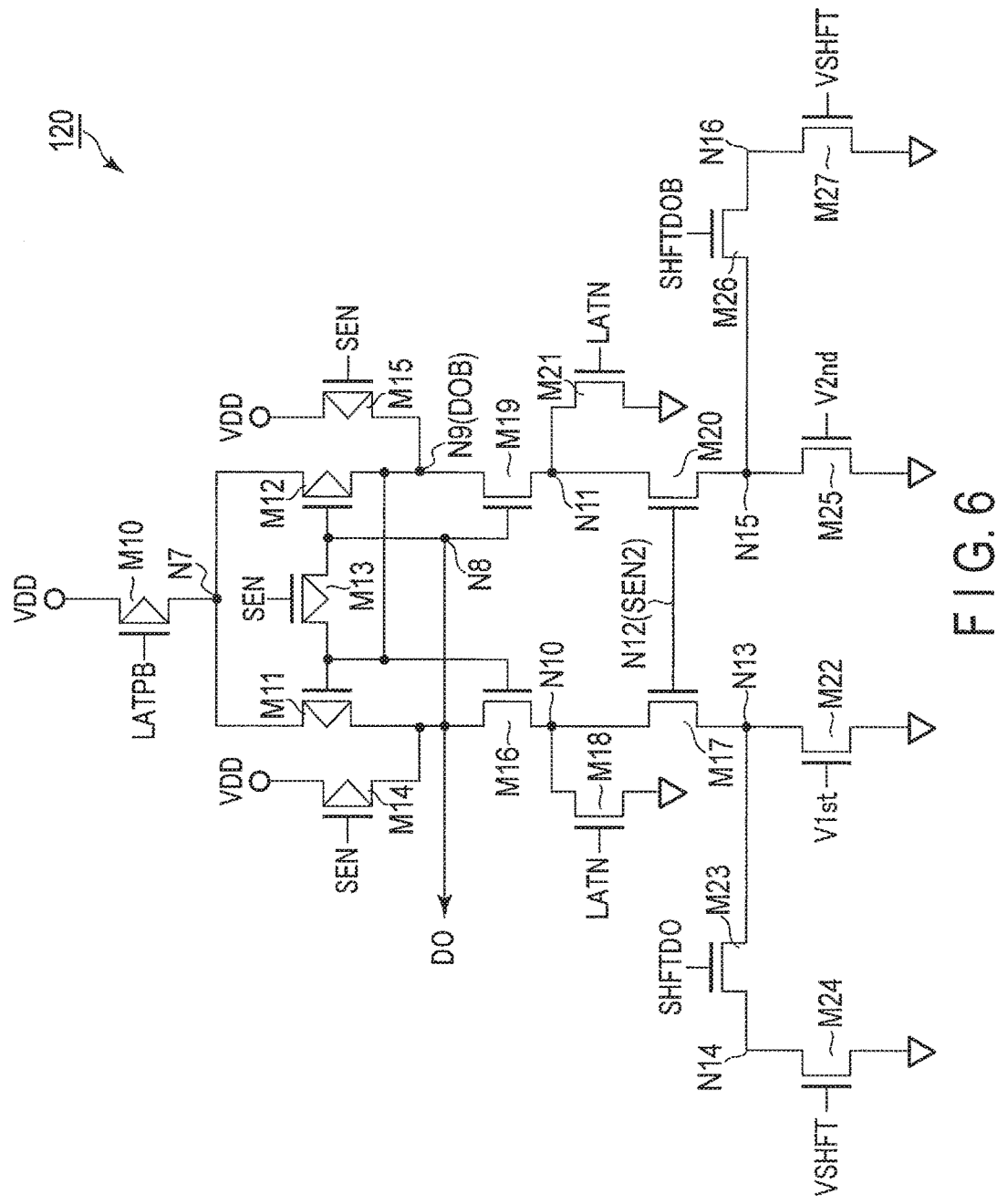
FIG. 6 is a circuit diagram showing the sense amplifier of the memory device according to the first embodiment.

As shown in FIG. 6, the sense amplifier 120 includes PMOS transistors M10, M11, M12, M13, M14, and M15, and NMOS transistors M16, M17, M18, M19, M20, M21, M22, M23, M24, M25, M26, and M27.

The power supply voltage VDD is applied to one terminal of the transistor M10, the other terminal is connected to a node N7, and a signal LATPB is supplied to the gate electrode.

One terminal of the transistor M11 is connected to the node N7, the other terminal is connected to a node N8, and the gate electrode is connected to a node N9.

One terminal of the transistor M12 is connected to the node N7, the other terminal is connected to the node N9, and the gate electrode is connected to the node N8.

One terminal of the transistor M13 is connected to the node N8, the other terminal is connected to the node N9, and a signal SEN is supplied to the gate electrode.

The power supply voltage VDD is applied to one terminal of the transistor M14, the other terminal is connected to the node N8, and the signal SEN is supplied to the gate electrode.

The power supply voltage VDD is applied to one terminal of the transistor M15, the other terminal is connected to the node N8, and the signal SEN is supplied to the gate electrode.

One terminal of the transistor M16 is connected to the node N8, the other terminal is connected to a node N10, and the gate electrode is connected to the node N9.

One terminal of the transistor M17 is connected to the node N10, the other terminal is connected to a node N13, and a signal SEN2 is supplied to the gate electrode via a node N12.

One terminal of the transistor M18 is connected to the node N10, the ground voltage VSS is applied to the other terminal, and a signal LATN is supplied to the gate electrode.

One terminal of the transistor M19 is connected to the node N9, the other terminal is connected to a node N11, and the gate electrode is connected to the node N8.

One terminal of the transistor M20 is connected to the node N11, the other terminal is connected to a node N15, and the signal SEN2 is supplied to the gate electrode via the node N12.

One terminal of the transistor M21 is connected to the node N11, the ground voltage VSS is applied to the other terminal, and the signal LATN is supplied to the gate electrode.

One terminal of the transistor M22 is connected to the node N13, the ground voltage VSS is applied to the other terminal, and the signal V1st is supplied to the gate electrode.

One terminal of the transistor M23 is connected to the node N13, the other terminal is connected to a node N14, and a signal SHFTDO is supplied to the gate electrode.

One terminal of the transistor M24 is connected to the node N14, the ground voltage VSS is applied to the other terminal, and a signal VSHFT is supplied to the gate electrode.

One terminal of the transistor M25 is connected to the node N15, the ground voltage VSS is applied to the other terminal, and the signal V2nd is supplied to the gate electrode.

One terminal of the transistor M26 is connected to the node N15, the other terminal is connected to a node N16, and a signal SHFTDOB is supplied to the gate electrode.

One terminal of the transistor M27 is connected to the node N16, the ground voltage VSS is applied to the other terminal, and the signal VSHFT is supplied to the gate electrode.

The potential of the node N8 is supplied to the IO circuit 16 as DO.

The potential of the node N9 is supplied to the IO circuit 16 as DOB.

The operation of the sense amplifier 120 will be described later.

<1-2> Operation

As described above, the MTJ element of the memory device according to the first embodiment stores data using a change in the resistance value. To read information stored in the MTJ element, the memory device supplies a read current (to be also referred to as a cell current) to the MTJ element. The memory device then converts the resistance value of the MTJ element into a current value or a voltage value and compares the value with a reference value, thereby determining the resistance state.

However, if the resistance variation of the MTJ element increases, the interval of the resistance value distribution of the "0" state and the "1" state may narrow. For this reason, in a read method of setting the reference value in the resistance value distribution and discriminating the state of the MTJ element based on the magnitude of a value relative to the reference value, the read margin considerably decreases.

In the first embodiment, shift signal information is added to the signal information (the current value or the voltage value) of one of the "0" state and the "1" state of the MTJ element to generate a reference signal. A self-reference read method of discriminating the initial state of the MTJ element based on the reference signal will be described.

The read operation of the memory system according to the first embodiment will be described next.

<1-2-1> Outline of Read Operation

The outline of the read operation of the memory system according to the first embodiment will be described with reference to FIG. 7.

[Step S1001]

Upon receiving a read instruction from the host 2, the memory controller 20 issues an active command and a read command to the memory device 10.

The memory device 10 receives the active command and the read command from the memory controller 20, and performs a first read operation (1st READ) for a read target memory cell. By the first read operation, the preamplifier 110 stores the resistance state of the read target memory cell as the voltage information (signal voltage) V1st.

[Step S1002]

The memory device 10 performs a "0" write operation (WRITE "0") for the memory cell as the target of the first read operation. Accordingly, "0" data is overwritten to the memory cell as the target of the first read operation. In this operation, the memory cell is set in a standard state ("0" here) to generate V2nd to be described later. That is, the write operation may be referred to as a standardization operation.

[Step S1003]

The memory device 10 performs a second read operation (2nd READ) for the memory cell as the target of the first read operation. By the second read operation, the preamplifier 110 generates the voltage information (signal voltage) V2nd.

[Step S1004]

Based on V2nd generated in step S1003, the sense amplifier 120 determines the result of V1st generated in step S1001. More specifically, the sense amplifier 120 compares a current obtained by adding a current I1st based on V1st and a reference current Ishift with a current I2nd based on V2nd, thereby determining data stored in the memory cell.

<1-2-2> Details of Read Operation

Details of the read operation of the memory system according to the first embodiment will be described with reference to the timing chart of FIG. 8.

[Time T0] to [Time T1]

In the first read operation (step S1001), the controller 17 sets the signal REN, the signal SW1P, and the signal Vclamp to "H (High)" level, and sets the signal RENB and the signal SW1B to "L (Low)" level (L<H).

Figure 9:
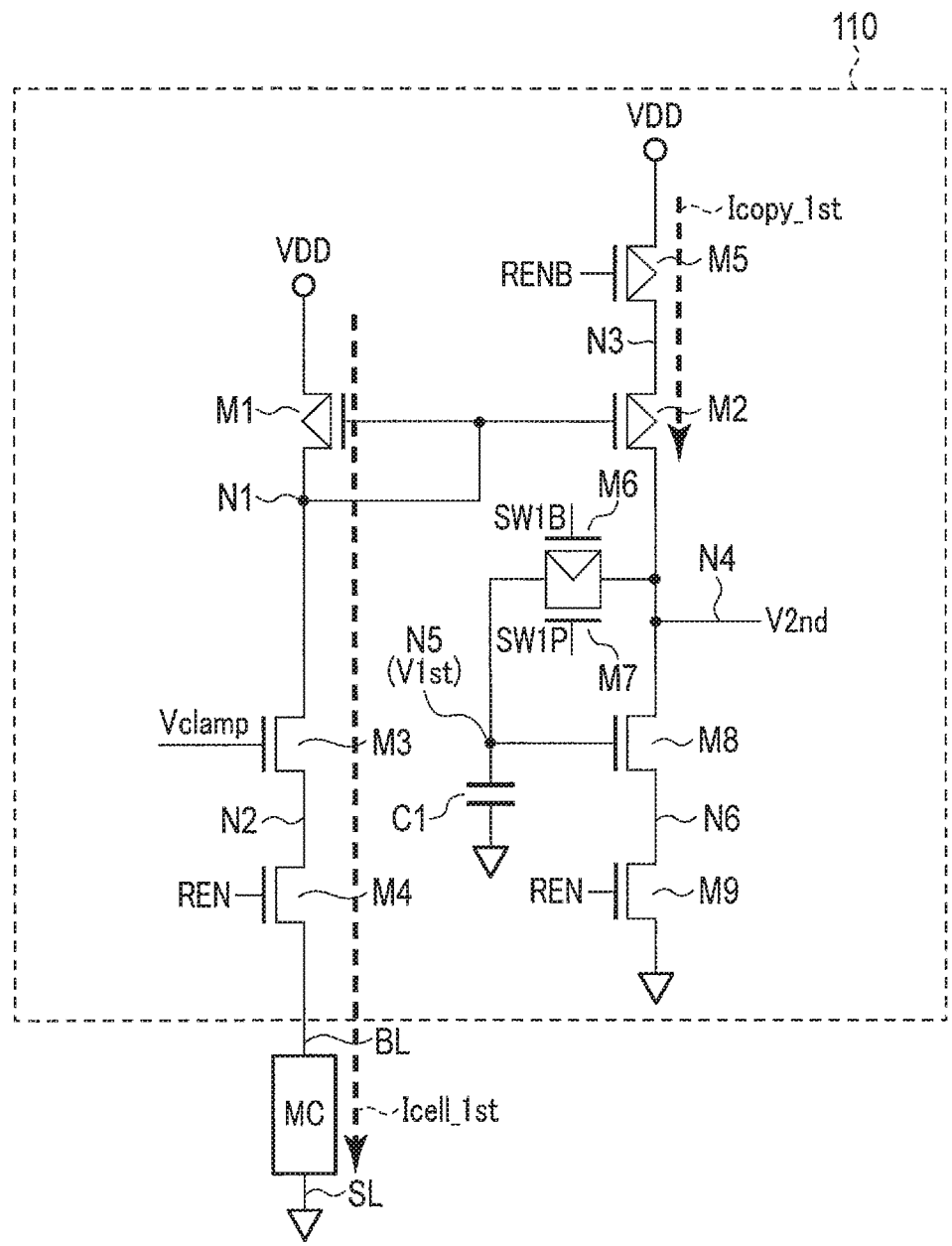
FIG. 9 is a circuit diagram showing the operation of the preamplifier of the memory device according to the first embodiment in a first read operation.

Accordingly, as shown in FIG. 9, the transistors M3, M4, M5, M6, and M7 change to the ON (conductive) state. The node N1 is thus grounded via the node N2, the bit line (global bit line), the memory cell MC, and the source line (global source line). As a result, the potential of the node N1 lowers, and the transistor M1 is turned on. The transistor M1 is driven as a diode-connection transistor.

In the ON state, the transistor M1 supplies a cell current (Icell_1st) to the memory cell MC.

The transistor M2 is driven based on the potential of the node N1. For this reason, the transistor M2 supplies a copy current (Icopy_1st) of the cell current (Icell_1st) to the node N4.

As described above, the transistors M1 and M2 constitute a current mirror.

The potential of the node N5 is the voltage information (signal voltage) V1st based on the copy current (Icopy_1st).

As described above, the preamplifier 110 supplies the cell current (Icell_1st) to the memory cell MC via a first current path formed from the transistors M1, M3, and M4. The preamplifier 110 also supplies the copy current (Icopy_1st) to the node N5 via a second current path formed from the transistors M2 and M5. The first current path and the second current path are electrically separated.

[Time T1] to [Time T2]

In the "0" write operation (step S1002), the controller 17 lowers the signal REN and the signal SW1P to "L" level, and raises a signal WRITE0, the signal RENB, and the signal SW1B to "H" level. The signal WRITE0 is a signal concerning the "0" write operation. When the signal WRITE0 is at "H" level, the "0" write operation is performed.

Accordingly, "0" data is written to the memory cell by a write driver (not shown).

Figure 10:
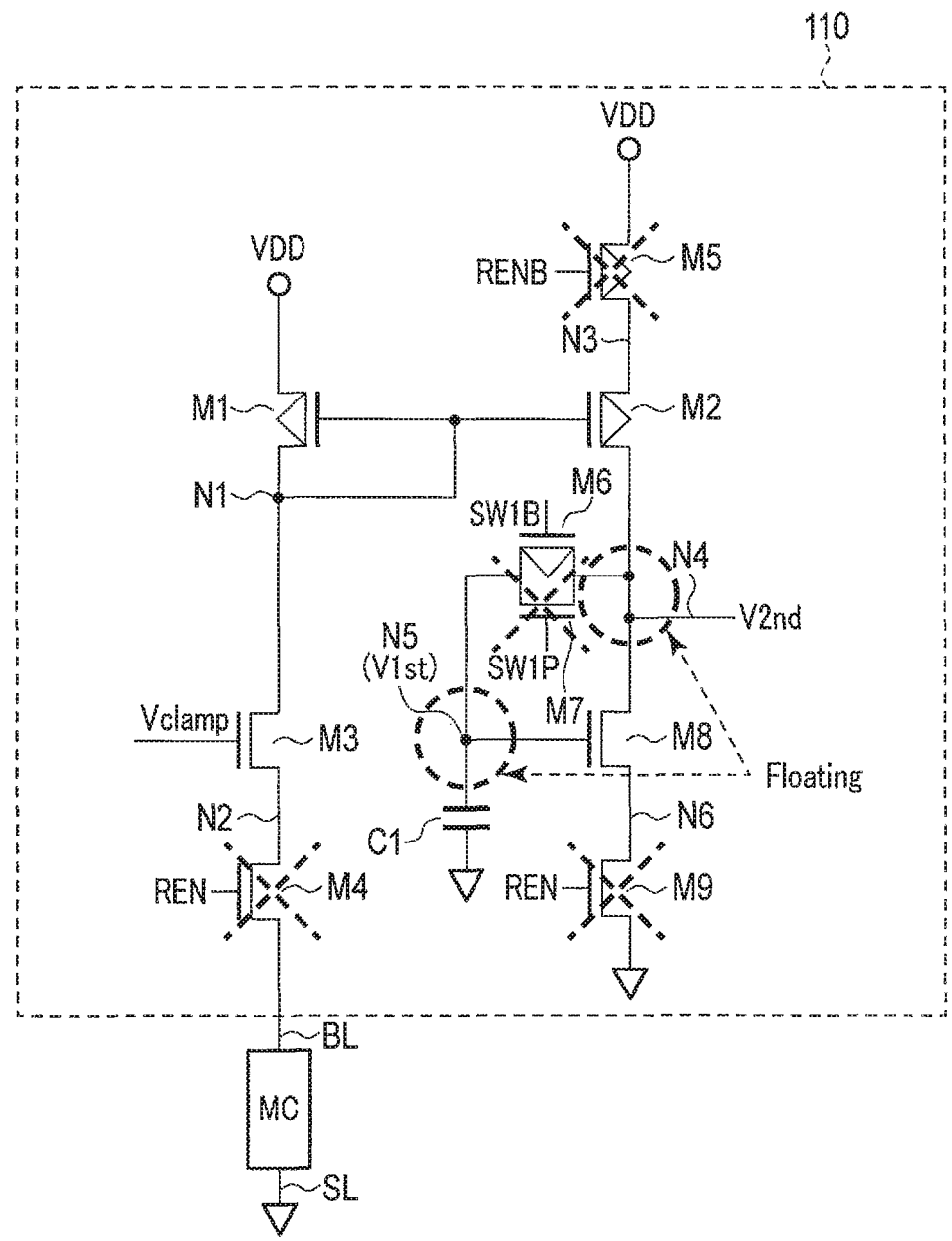
FIG. 10 is a circuit diagram showing the operation of the preamplifier of the memory device according to the first embodiment in a write operation.

In addition, as shown in FIG. 10, the transistor M5, M6, M7, and M9 change to the OFF (nonconductive) state. Accordingly, the nodes N4 and N5 are electrically set in a floating state. The node N5 stores the voltage information (signal voltage) V1st.

[Time T2] to [Time T3]

In the second read operation (step S1003), the controller 17 raises the signal REN to "H" level, and lowers the signal WRITE0 and the signal RENB to "L" level.

Figure 11:
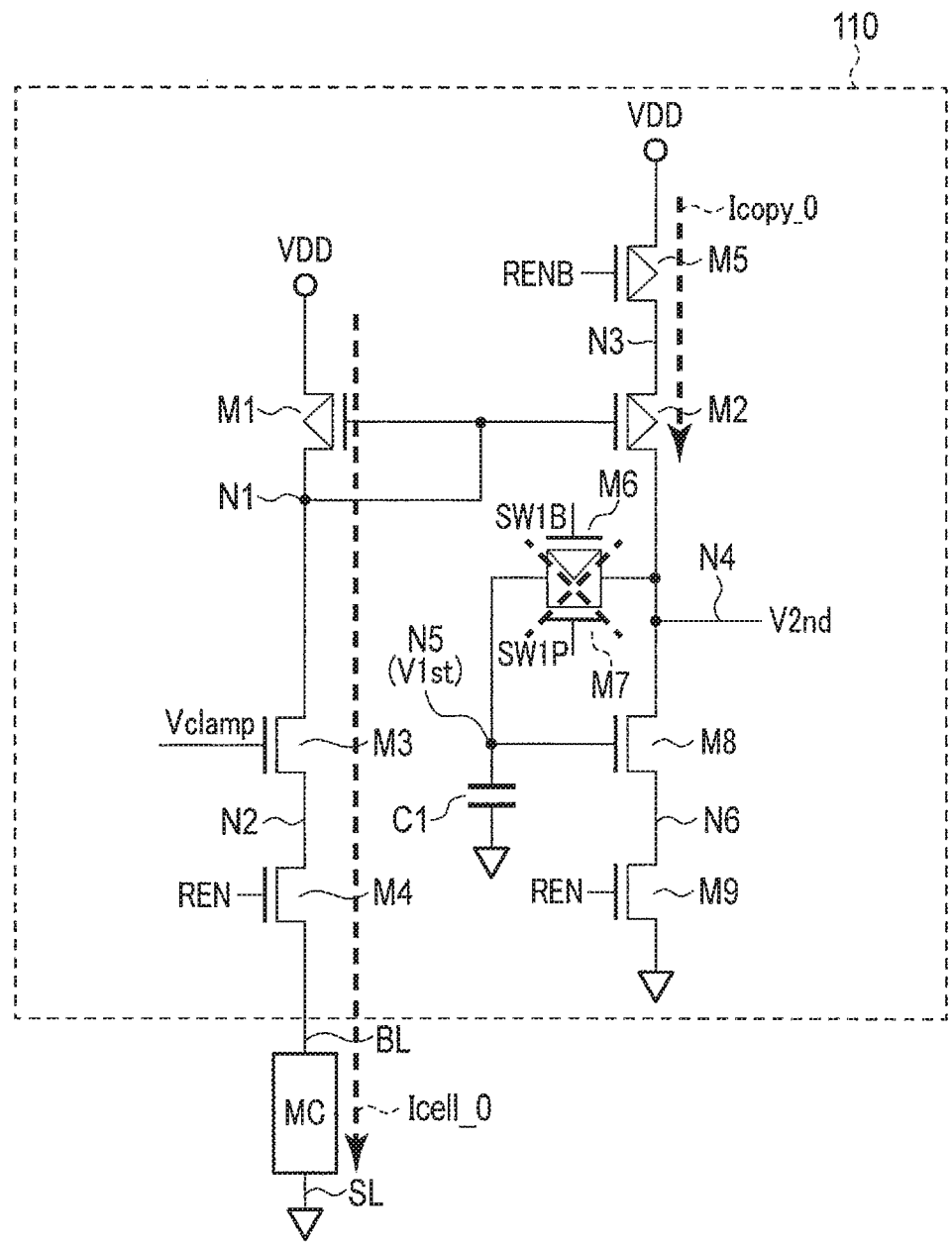
FIG. 11 is a circuit diagram showing the operation of the preamplifier of the memory device according to the first embodiment in a second read operation.

Accordingly, as shown in FIG. 11, the transistors M3, M4, M5, and M9 are turned on. The node N1 is thus grounded via the node N2, the bit line (global bit line), the memory cell MC, and the source line (global source line). As a result, the potential of the node N1 lowers, and the transistor M1 is turned on. The transistor M1 is driven as a diode-connection transistor.

In the ON state, the transistor M1 supplies a cell current (Icell_0) to the memory cell MC.

The transistor M2 is driven based on the potential of the node N1. For this reason, the transistor M2 supplies a copy current (Icopy_0) of the cell current (Icell_0) to the node N4.

In addition, the transistor M8 is turned on based on V1st.

The potential of the node N4 is the voltage information (signal voltage) V2nd based on the copy current (Icopy_0) and V1st.

[Time T3] to [Time T5]

In the determination operation (step S1004), the controller 17 lowers the signal REN to "L" level, and raises the signal RENB and the signal SEN2 to "H" level. The controller 17 also sets the signal SHFTDO, the signal VSHFT, and the signal LATPB to "H" level, and sets the signal SHFTDOB, the signal LATN, and the signal SEN to "L" level.

Accordingly, the transistors M5 and M9 of the preamplifier 110 change to the OFF (nonconductive) state. The node N4 thus stores the voltage information (signal voltage) V2nd.

Figure 12:
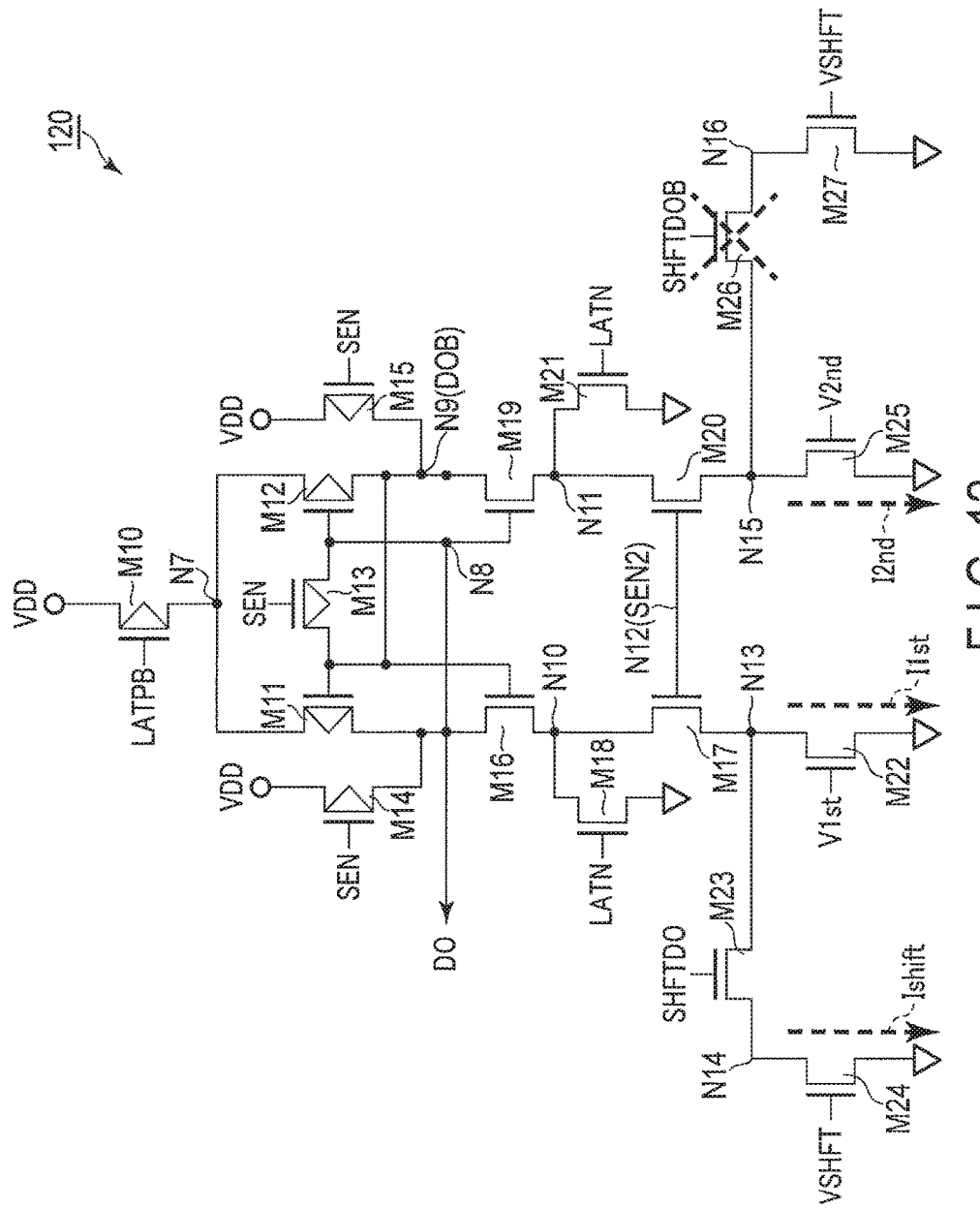
FIG. 12 is a circuit diagram showing the operation of the sense amplifier of the memory device according to the first embodiment in a determination operation.

As shown in FIG. 12, in the sense amplifier 120, the transistors M13, M14, M15, M17, M19, M20, M22, M23, M24, and M25 are turned on.

Accordingly, the transistor M22 supplies a current I1st corresponding to V1st, and the transistor M24 supplies a shift current Ishift corresponding to VSHFT.

In addition, the transistor M25 supplies a current I2nd corresponding to V2nd.

When the signal SEN is set to "H" level, the transistors M14 and M15 change to the OFF state, and the current supply from the transistors M14 and M15 is cut off. Accordingly, the potential of the node N8 is decided based on the current I1st and the shift current Ishift. The potential of the node N9 is decided based on the current I2nd. Hence, a voltage difference is generated between the node N8 and the node N9. The voltage difference is widened immediately by the positive feedback of the transistors M11, M22, M16, and M19.

The sense amplifier 120 thus determines the signal DO and the signal DOB.

[Time T5]

When the determination operation (step S1004) ends, the controller 17 lowers the signal LATPB to "L" level, and raises the signal LATN to "H" level. The transistors M10, M18, and M21 of the sense amplifier 120 are thus turned on.

Accordingly, the potential difference between the signal DO and the signal DOB is widened to the difference between "H" level and "L" level.

<1-2-3> Determination Method of Read Operation

A detailed determination method in the determination operation (step S1004) will be described next.

The operation characteristic of the preamplifier 110 will be described with reference to FIG. 13.

Figure 13:
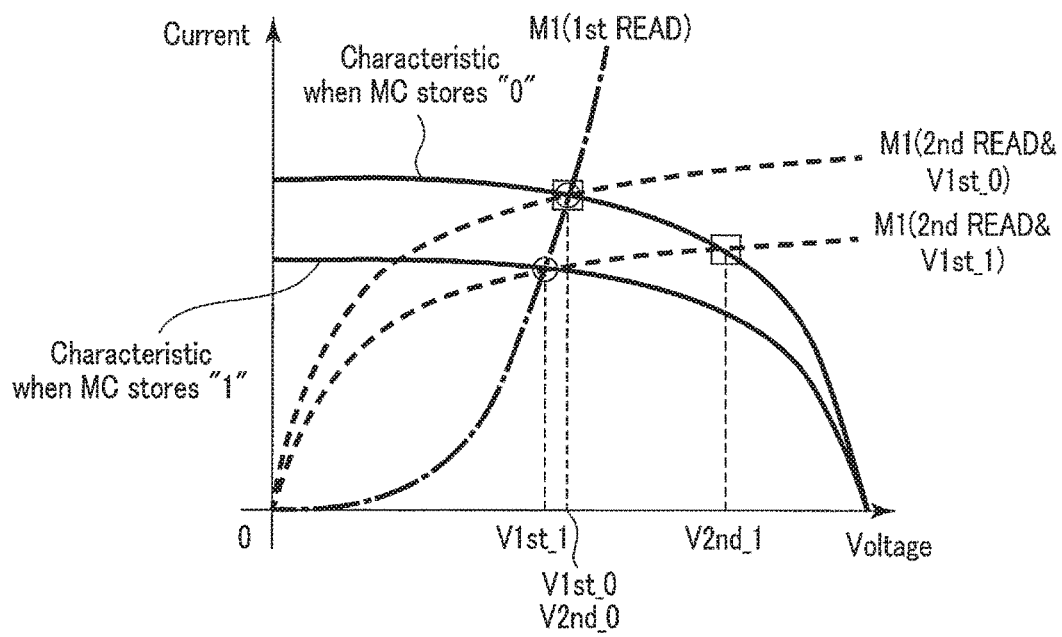
FIG. 13 is a graph showing the relationship between the characteristic of a transistor M8 and the characteristic of a memory cell in the first read and the relationship between the characteristic of the transistor M8 and the characteristic of the memory cell in the second read.

FIG. 13 shows the relationship between the characteristic of the transistor M8 and the characteristic of the memory cell in the first read. FIG. 13 also shows the relationship between the characteristic of the transistor M8 and the characteristic of the memory cell in the second read.

As shown in FIG. 13, when the memory cell stores "1" data, V1st is set to V1st_1 by the first read operation. In the second read operation, if V1st is V1st_1, V2nd is V2nd_1 (V1st_1<V2nd_1).

As shown in FIG. 13, when the memory cell stores "0" data, V1st is set to V1st_0 (V1st_1<V1st_0<V2nd_1) by the first read operation. In the second read operation, if V1st is V1st_0, V2nd is V2nd_0 (V1st_0=V2nd_0).

Figure 14:
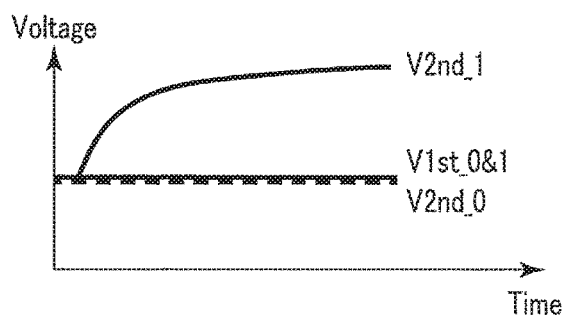
FIG. 14 is a graph showing the relationship of voltages after the second read operation.

FIG. 14 shows the relationship of voltages. As shown in FIG. 14, V1st_0, V1st_1, and V2nd_0 almost equal.

The operation of the sense amplifier 120 in a case in which the memory cell stores "1" data at the time of the first read operation will be described next with reference to FIG. 15. If the memory cell stores "1" data at the time of the first read operation, V1st is V1st_1, and V2nd is V2nd_1.

As described above, V2nd_1 is higher than V1st_1. For this reason, I2nd (I2nd_1) flowing to the transistor M25 based on V2nd_1 is larger than I1st (I1st_1) flowing to the transistor M22 based on V1st_1.

Additionally, as described above, the sense amplifier 120 compares I1st+Ishift with I2nd. Note that VSHFT is set such that I1st_1+Ishift becomes smaller than I2nd_1.

Figure 15:
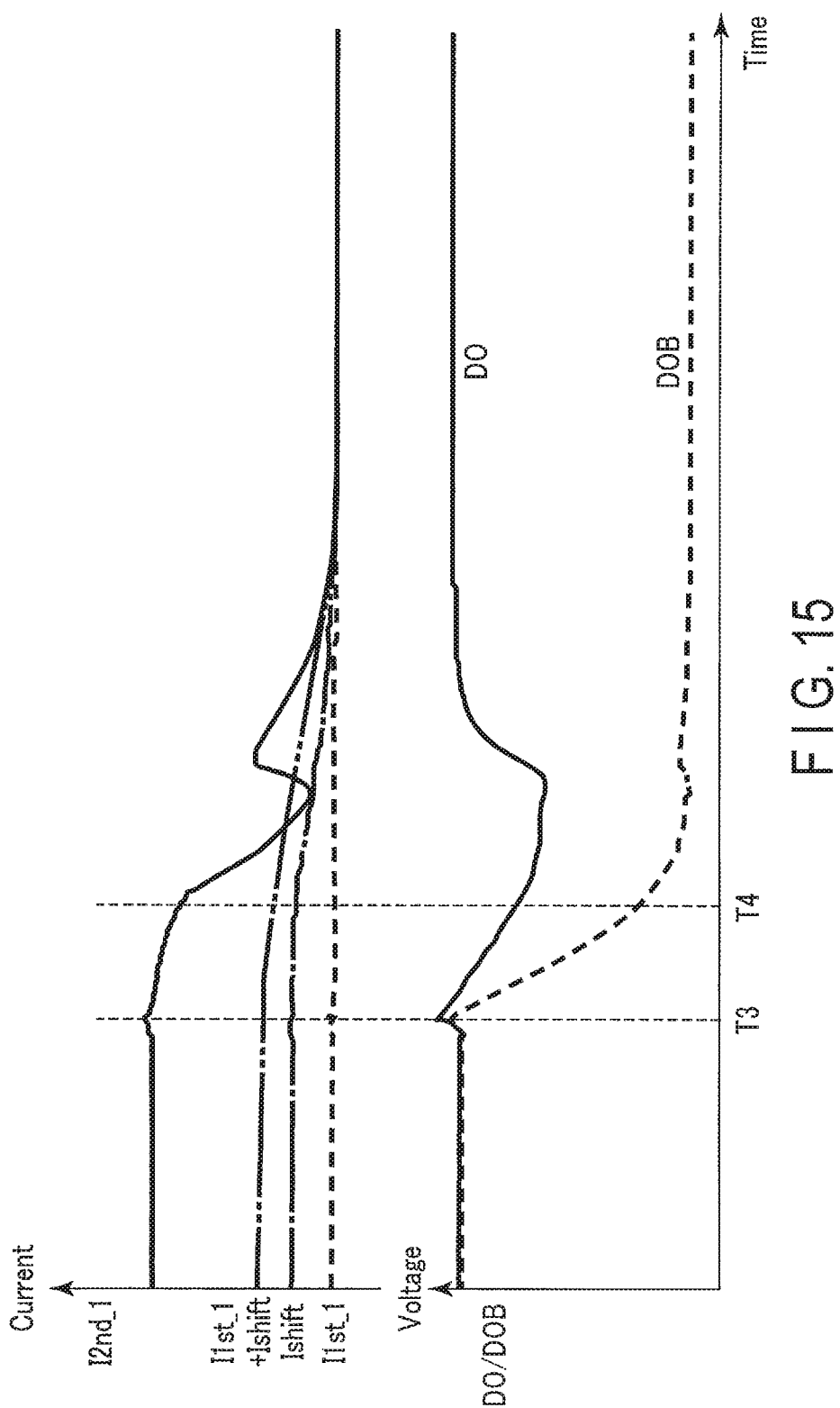
FIG. 15 is a timing chart showing currents and voltages generated in the sense amplifier in a case in which the memory cell stores "1" data at the time of the first read operation.

However, as shown in FIG. 15, I2nd_1 is much larger than I1st_1+Ishift. For this reason, when the determination operation is performed in times T3 to T4 of FIG. 8, the signal. DO and the signal DOB can appropriately be generated.

The operation of the sense amplifier 120 in a case in which the memory cell stores "0" data at the time of the first read operation will be described next with reference to FIG. 16. If the memory cell stores "0" data at the time of the first read operation, V1st is V1st_0, and V2nd is V2nd_0.

As described above, V2nd_0 almost equals V1st_0. For this reason, I2nd (I2nd_0) flowing to the transistor M25 based on V2nd_0 almost equals I1st (I1st_0) flowing to the transistor M22 based on V1st_0.

As described above, the sense amplifier 120 compares I1st+Ishift with I2nd. Note that VSHFT is set such that Ishift becomes I2nd_0.

As shown in FIG. 16, I2nd_0 is smaller than I1st_0+Ishift. For this reason, when the determination operation is performed in times T3 to T4 of FIG. 8, the signal DO and the signal DOB can appropriately be generated.

Note that in the above-described embodiment, the operation of writing "0" to the memory cell as the target of the first read operation by the memory device 10 in step S1002 has been described. However, the memory device 10 may write "1" to the memory cell as the target of the first read operation in step S1002. That is, "1" may be the standard state.

Figure 17:
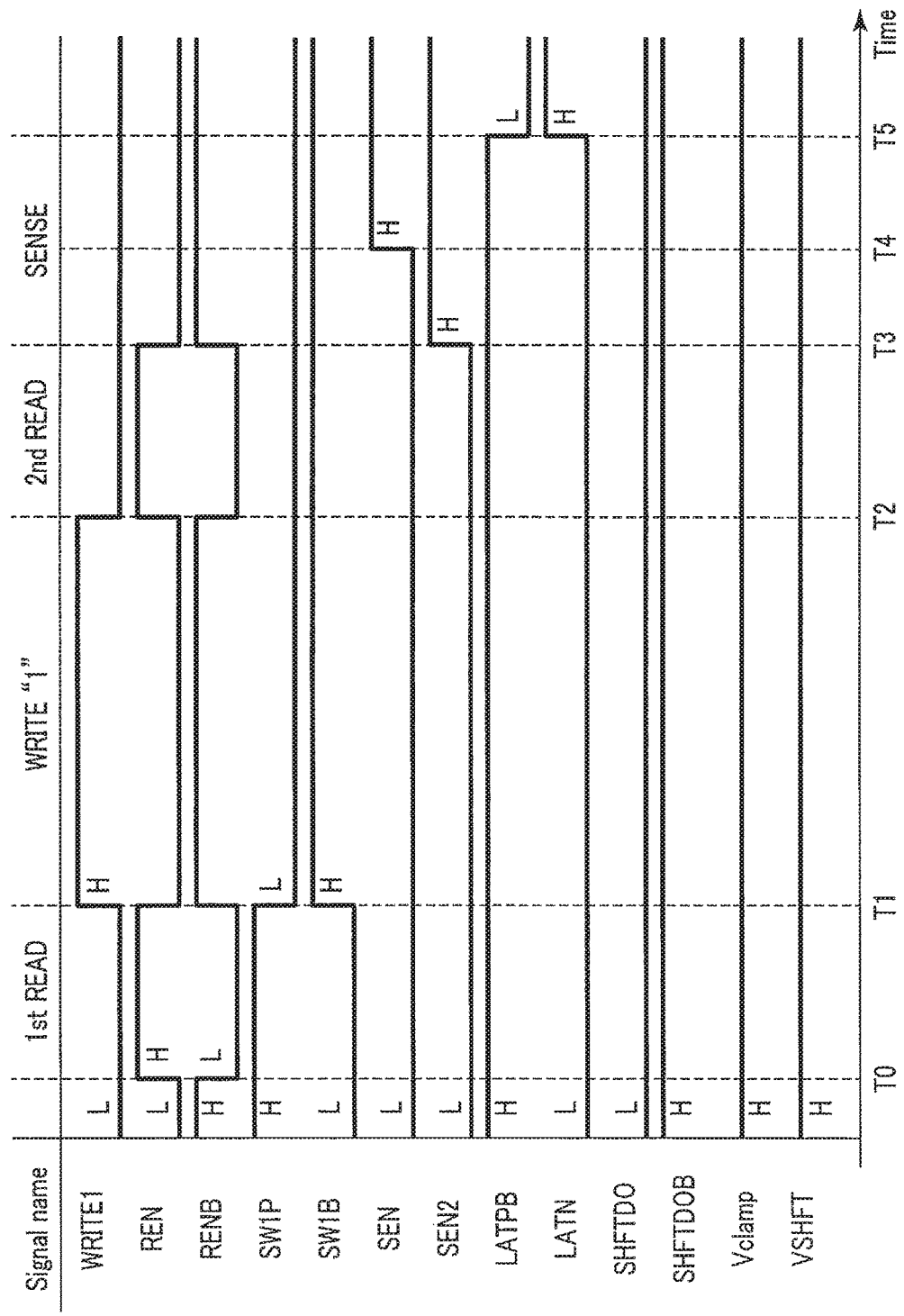
FIG. 17 is a timing chart of the read operation of the memory system according to the first embodiment.

When writing "1" in step S1002, the controller 17 sets the signal SHFTDO to "L" level, and sets the signal SHFTDOB to "H" level in the read operation (see FIG. 17). Accordingly, I2nd+Ishift is supplied to the node N9, and I1st is supplied to the node N8 in the determination operation (step S1004). The determination operation can thus be performed (see FIG. 18).

<1-3> Effects

According to the above-described embodiment, in the "0" write operation, the node N4 configured to generate V2nd is set in the floating state. It is therefore possible to perform a high-quality read operation by easy control.

For easy understanding of the above-described embodiment, a comparative example will be described below.

Figure 19:
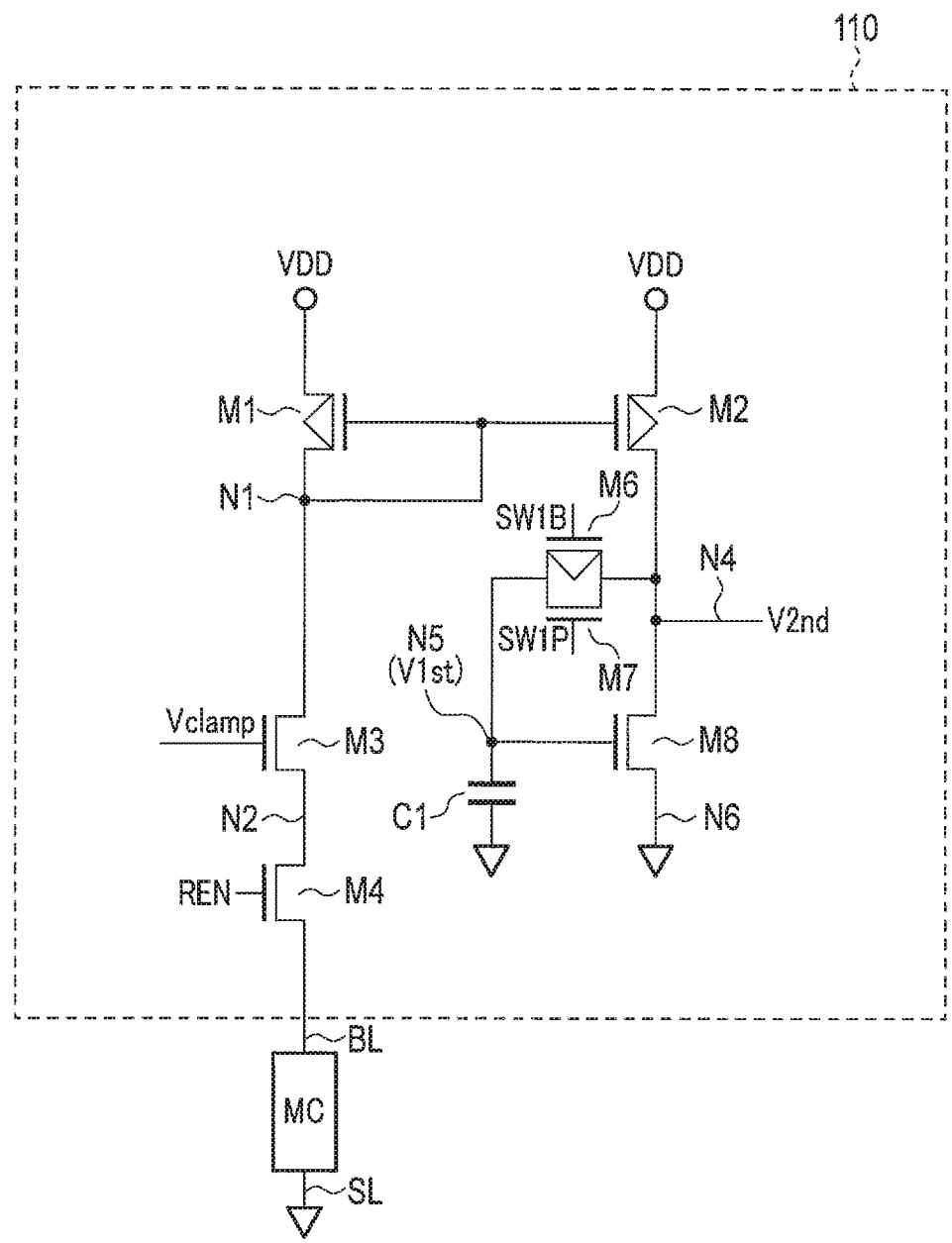
FIG. 19 is a circuit diagram showing the preamplifier of a memory device according to a comparative example of the first embodiment.

As shown in FIG. 19, a preamplifier according to the comparative example does not include the transistors M5 and M9. For this reason, in the preamplifier according to the comparative example, the node N4 is grounded at the time of the write operation.

The waveform of a voltage at the time of the read operation will be described with reference to FIG. 20.

As shown in FIG. 20, in the memory device according to the comparative example, the node N4 is discharged via the transistor M8 in the "0" write operation after the first read operation (times T1 to T2). Hence, the potential of V2nd is VSS, as shown in FIG. 20.

When the second read operation starts at the time T2, the preamplifier 110 starts precharging the node N4. At this time, since the node N4 needs to be charged, time is required until the potential of the node N4 stabilizes.

On the other hand, according to the above-described embodiment, in the "0" write operation, the transistors M5 and M9 are turned off. Hence, the node N4 is set in the floating state, and V2nd keeps the potential at the time of the first read operation during the "0" write operation (times T1 to T2), as show in FIG. 20.

For this reason, when the second read operation starts at the time T2, V2nd quickly stabilizes as compared to the comparative example because the preamplifier 110 need not charge the node N4.

As described above, according to this embodiment, the node N4 configured to generate V2nd is set in the floating state in the "0" write operation, thereby speeding up the read operation. As a result, it is possible to provide a memory device capable of performing a high-quality read operation by easy control.

<2> Second Embodiment

The second embodiment will be described. In the second embodiment, another example of the preamplifier will be described. Note that the basic arrangement and the basic operation of a memory system according to the second embodiment are the same as those of the memory system according to the above-described first embodiment. Hence, a description of matters explained in the above-described first embodiment and matters easily supposable from the above-described first embodiment will be omitted.

<2-1> Arrangement of Preamplifier

The arrangement of a preamplifier 110 of a memory device according to the second embodiment will be described next with reference to FIG. 21.

As shown in FIG. 21, the basic arrangement of the preamplifier 110 is the same as the arrangement described with reference to FIG. 5. The preamplifier is different from the preamplifier described with reference to FIG. 5 in that a signal REN2B is supplied to the gate electrode of a transistor M5, and a signal REN2 is supplied to the gate electrode of a transistor M9.

<2-2> Details of Read Operation

Details of the read operation of the memory system according to the second embodiment will be described with reference to the timing chart of FIG. 22.

[Time T0] to [Time T1]

In the first read operation (step S1001), a controller 17 sets a signal REN, the signal REN2, a signal SW1P, and a signal Vclamp to "H" level, and sets a signal RENB, the signal REN2B, and a signal SW1B to "L" level.

Accordingly, the preamplifier 110 performs the same operation as that described with reference to FIG. 9.

[Time T1] to [Time T2]

In the "0" write operation (step S1002), the controller 17 lowers the signal REN, the signal REN2, and the signal SW1P to "L" level, and raises a signal WRITE0, the signal RENB, the signal REN2B, and the signal SW1B to "H" level.

Accordingly, the preamplifier 110 per forms the same operation as that described with reference to FIG. 10.

[Time T2] to [Time T3]

In the second read operation (step S1003), the controller 17 raises the signal REN and the signal REN2 to "H" level, and lowers the signal WRITE0, the signal RENB, and the signal REN2B to "L" level.

Accordingly, a sense circuit 100 performs the same operation as that described with reference to FIGS. 11 and 12.

[Time T3] to [Time T5]

A memory system 1 performs the same operation as that described in the first embodiment.

Note that in the above-described embodiment, the operation of writing "0" to the memory cell as the target of the first read operation by a memory device 10 in step S1002 has been described. However, the memory device 10 may write "1" to the memory cell as the target of the first read operation in step S1002. That is, "1" may be the standard state.

Figure 23:
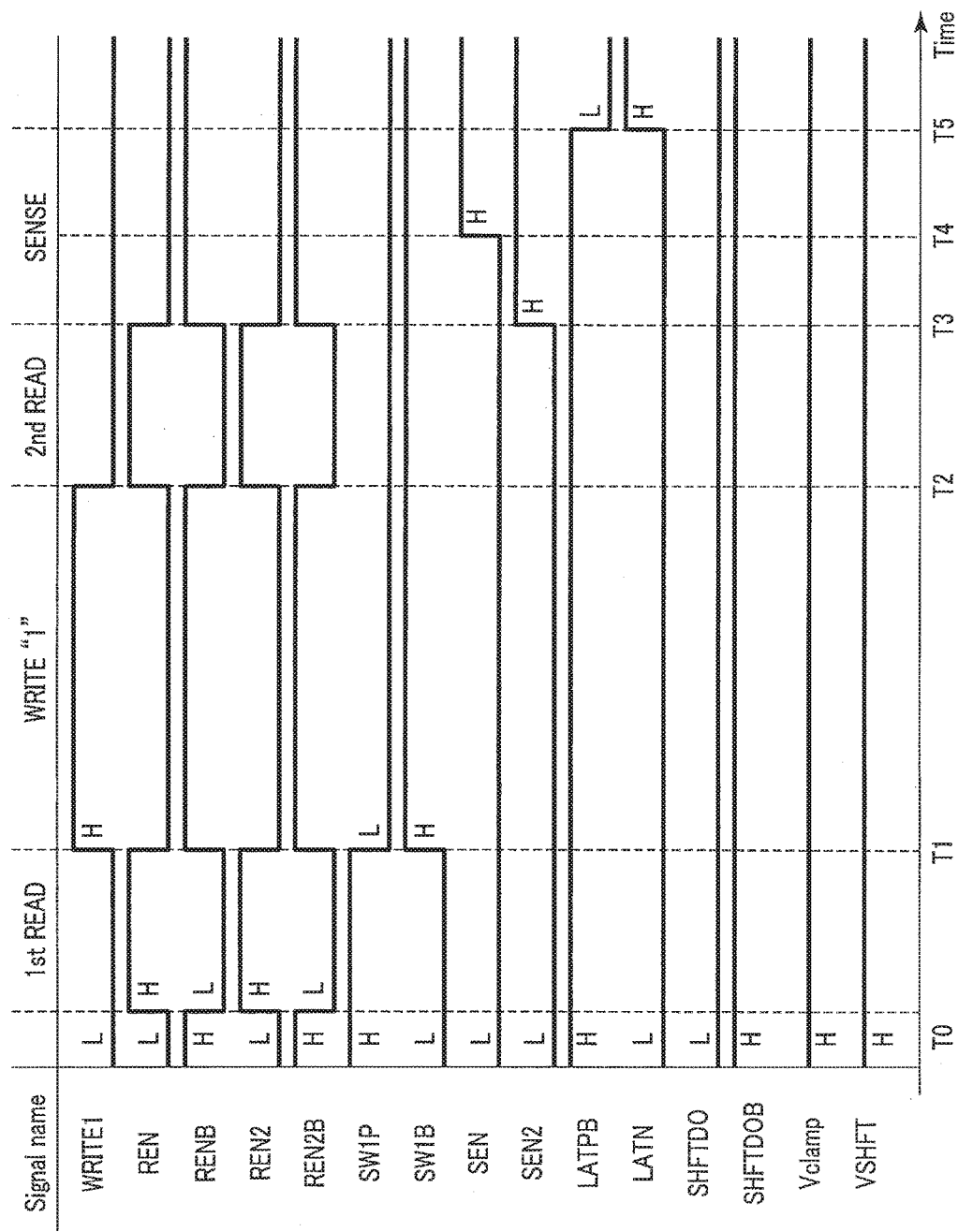
FIG. 23 is a timing chart of the read operation of the memory system according to the second embodiment.

When writing "1" in step S1002, the controller 17 sets a signal SHFTDO to "L" level, and sets a signal SHFTDOB to "H" level in the read operation (see FIG. 23). Accordingly, I2nd+Ishift is supplied to a node N9, and I1st is supplied to a node N8 in the determination operation (step S1004). The determination operation can thus be performed (see FIG. 18).

<2-3> Effects

According to the above-described embodiment, the same effects as in the first embodiment can be obtained.

<3> Third Embodiment

The third embodiment will be described. In the third embodiment, another example of the sense amplifier will be described. Note that the basic arrangement and the basic operation of a memory system according to the third embodiment are the same as those of the memory systems according to the above-described first and second embodiments. Hence, a description of matters explained in the above-described first and second embodiments and matters easily supposable from the above-described first and second embodiments will be omitted.

<3-1> Arrangement of Sense Amplifier

The arrangement of a sense amplifier 120 of a memory device according to the third embodiment will be described next with reference to FIG. 24.

As shown in FIG. 24, the sense amplifier 120 includes PMOS transistors M28, M29, M30, and M33, and NMOS transistors M31, M32, M34, M35, M36, M37, M38, M39, and M40.

A power supply voltage VDD is applied to one terminal of the transistor M28, the other terminal is connected to a node N17, and a signal LATPB is supplied to the gate electrode.

One terminal of the transistor M29 is connected to the node N17, the other terminal is connected to a node N18, and the gate electrode is connected to a node N19.

One terminal of the transistor M30 is connected to the node N17, the other terminal is connected to the node N19, and the gate electrode is connected to the node N18.

One terminal of the transistor M31 is connected to the node N18, the other terminal is connected to a node N20, and the gate electrode is connected to the node N19.

One terminal of the transistor M32 is connected to the node N19, the other terminal is connected to the node N20, and the gate electrode is connected to the node N18.

One terminal of the transistor M33 is connected to the node N18, the other terminal is connected to the node N19, and a signal SENB is supplied to the gate electrode.

One terminal of the transistor M34 is connected to the node N20, a ground voltage VSS is applied to the other terminal, and a signal LATN is supplied to the gate electrode.

One terminal of the transistor M35 is connected to the node N18, the ground voltage VSS is applied to the other terminal, and a signal V1st is supplied to the gate electrode.

One terminal of the transistor M36 is connected to the node N18, the other terminal is connected to a node N21, and a signal SHFTDO is supplied to the gate electrode.

One terminal of the transistor M37 is connected to the node N21, the ground voltage VSS is applied to the other terminal, and a signal VSHFT is supplied to the gate electrode.

One terminal of the transistor M38 is connected to the node N19, the ground voltage VSS is applied to the other terminal, and a signal V2nd is supplied to the gate electrode.

One terminal of the transistor M39 is connected to the node N19, the other terminal is connected to a node N22, and a signal SHFTDOB is supplied to the gate electrode.

One terminal of the transistor M40 is connected to the node N22, the ground voltage VSS is applied to the other terminal, and the signal VSHFT is supplied to the gate electrode.

The potential of the node N18 is supplied to an IO circuit 16 as DO.

The potential of the node N19 is supplied to the IO circuit 16 as DOB.

<3-2> Details of Read Operation

Figure 25:
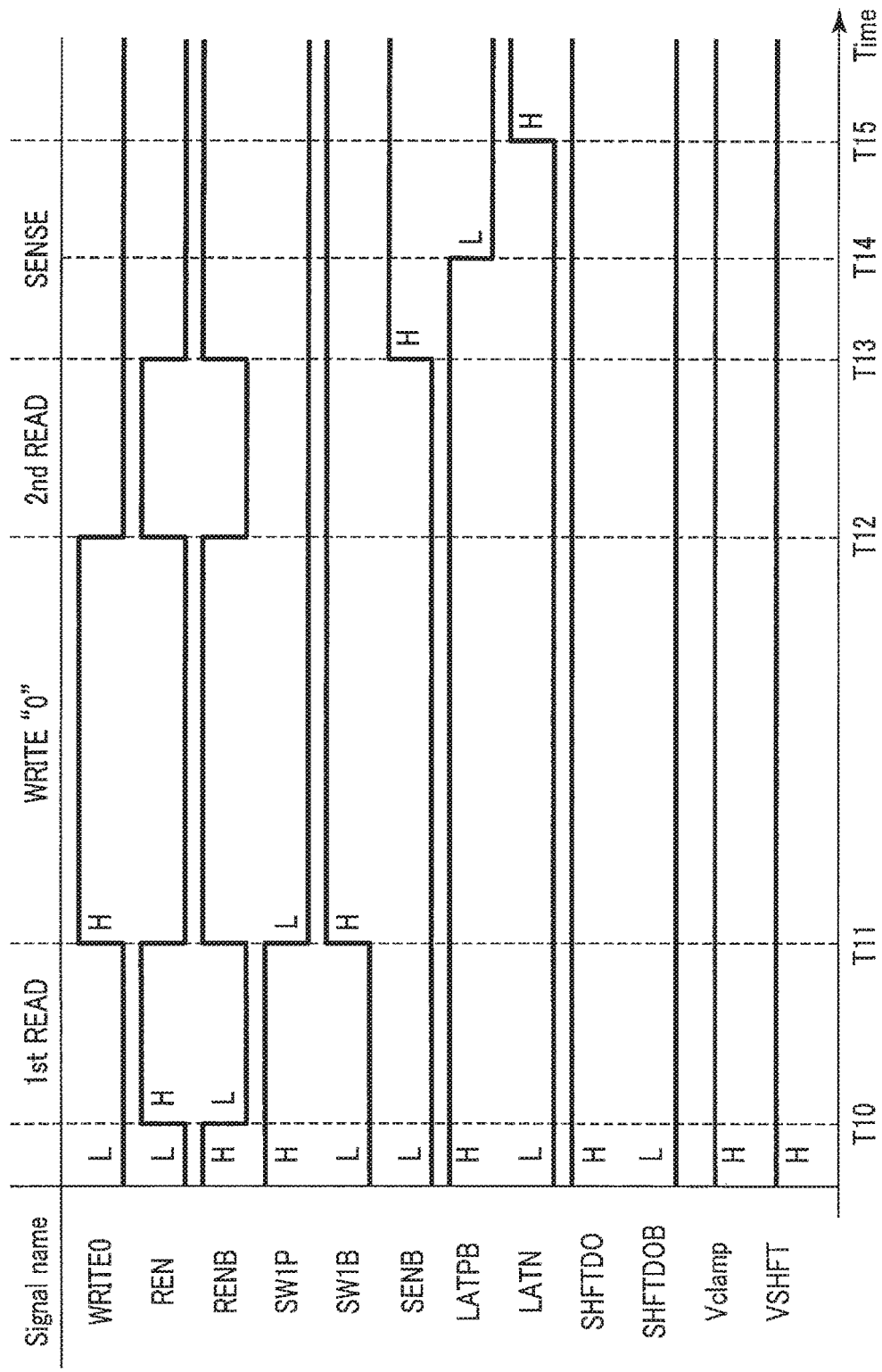
FIG. 25 is a timing chart of the read operation of a memory system according to the third embodiment.

Details of the read operation of the memory system according to the third embodiment will be described with reference to the timing chart of FIG. 25. For example, a case in which the preamplifier described in the first embodiment is applied will be described here.

[Time T10] to [Time T13]

Figure 8:
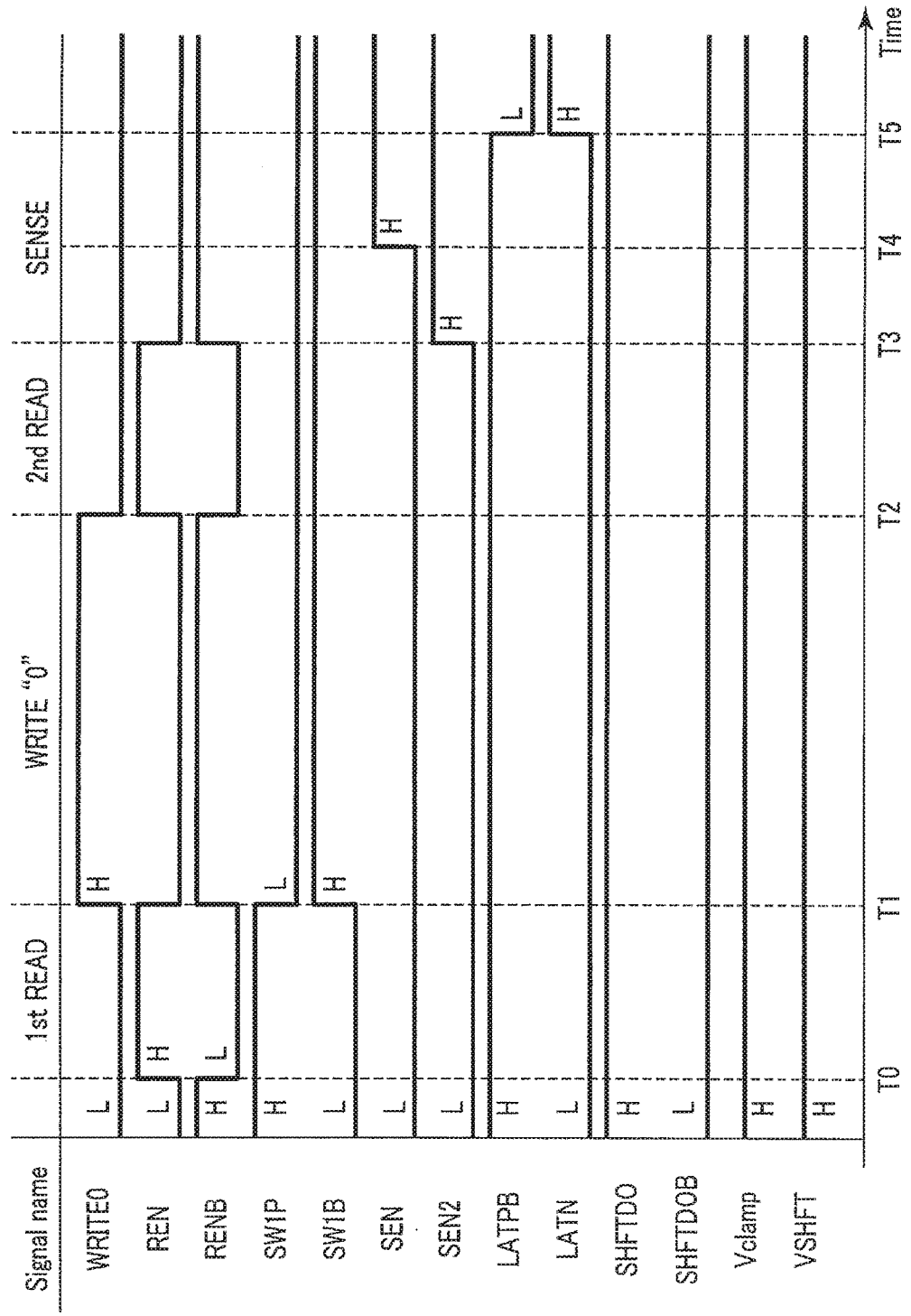
FIG. 8 is a timing chart of the read operation of the memory system according to the first embodiment.

A memory device 10 performs the same operation as in the times T0 to T3 described in the first embodiment with reference to FIG. 8.

[Time T13] to [Time T15]

In the determination operation (step S1004), a controller 17 lowers a signal REN to "L" level, and raises a signal RENB and the signal SENB to "H" level. The controller 17 also sets the signal SHFTDO, the signal VSHFT, and the signal LATPB to "H" level, and sets the signal SHFTDOB and the signal LATN to "L" level.

Accordingly, transistors M5 and M9 of the preamplifier 110 change to the OFF (nonconductive) state. A node N4 thus stores the voltage information (signal voltage) V2nd.

As shown in FIG. 26, in the sense amplifier 120, the transistors M35, M36, M37, and M38 are turned on.

Accordingly, the transistor M35 supplies a current I1st corresponding to V1st, and the transistor M37 supplies a shift current Ishift corresponding to VSHFT. That is, the potential of the node N18 is decided based on the current I1st and the shift current Ishift.

In addition, the transistor M38 supplies a current I2nd corresponding to V2nd. That is, the potential of the node N19 is decided based on the current I2nd.

At the time T14 at which a sufficient difference is generated between the potential of the node N18 and the potential of the node N19, the controller 17 lowers the signal LATPB to "L" level.

Accordingly, the sense amplifier 120 determines the signal DO and the signal DOB.

[Time T15]

When the determination operation (step S1004) ends, the controller 17 raises the signal LAIN to "H" level. The transistor M34 of the sense amplifier 120 is thus turned on. Accordingly, the potential difference between the signal DO and the signal DOB is widened to the difference between "H" level and "L" level.

Note that in the above-described embodiment, the operation of writing "0" to the memory cell as the target of the first read operation by the memory device 10 in step S1002 has been described. However, the memory device 10 may write "1" to the memory cell as the target of the first read operation in step S1002. That is, "1" may be the standard state.

Figure 27:
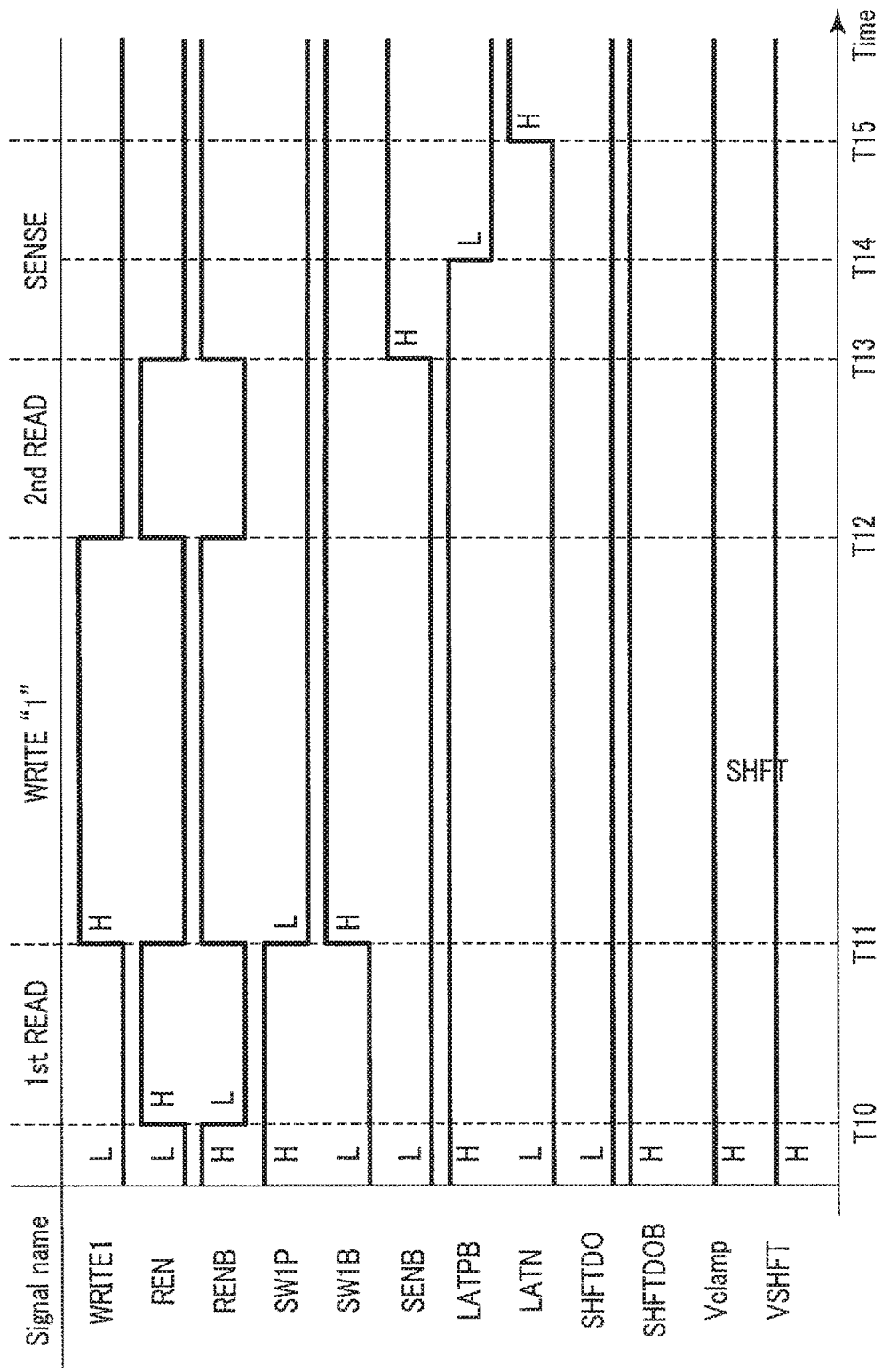
FIG. 27 is a timing chart of the read operation of the memory system according to the third embodiment.

Note that when writing "1" in step S1002, the controller 17 sets the signal SHFTDO to "L" level, and sets the signal SHFTDOB to "H" level in the read operation (see FIG. 27). Accordingly, I2nd+Ishift is supplied to the node N19, and I1st is supplied to the node N18 in the determination operation (step S1004) (see FIG. 28). The determination operation can thus be performed.

<3-3> Effects

According to the above-described embodiment, the same effects as in the first embodiment can be obtained.

<4> Fourth Embodiment

The fourth embodiment will be described. In the fourth embodiment, a case in which the preamplifier described in the second embodiment is applied to the sense circuit of the third embodiment will be described. Note that the basic arrangement and the basic operation of a memory system according to the fourth embodiment are the same as those of the memory systems according to the above-described first to third embodiments. Hence, a description of matters explained in the above-described first to third embodiments and matters easily supposable from the above-described first to third embodiments will be omitted.

<4-1> Details of Read Operation

Figure 29:
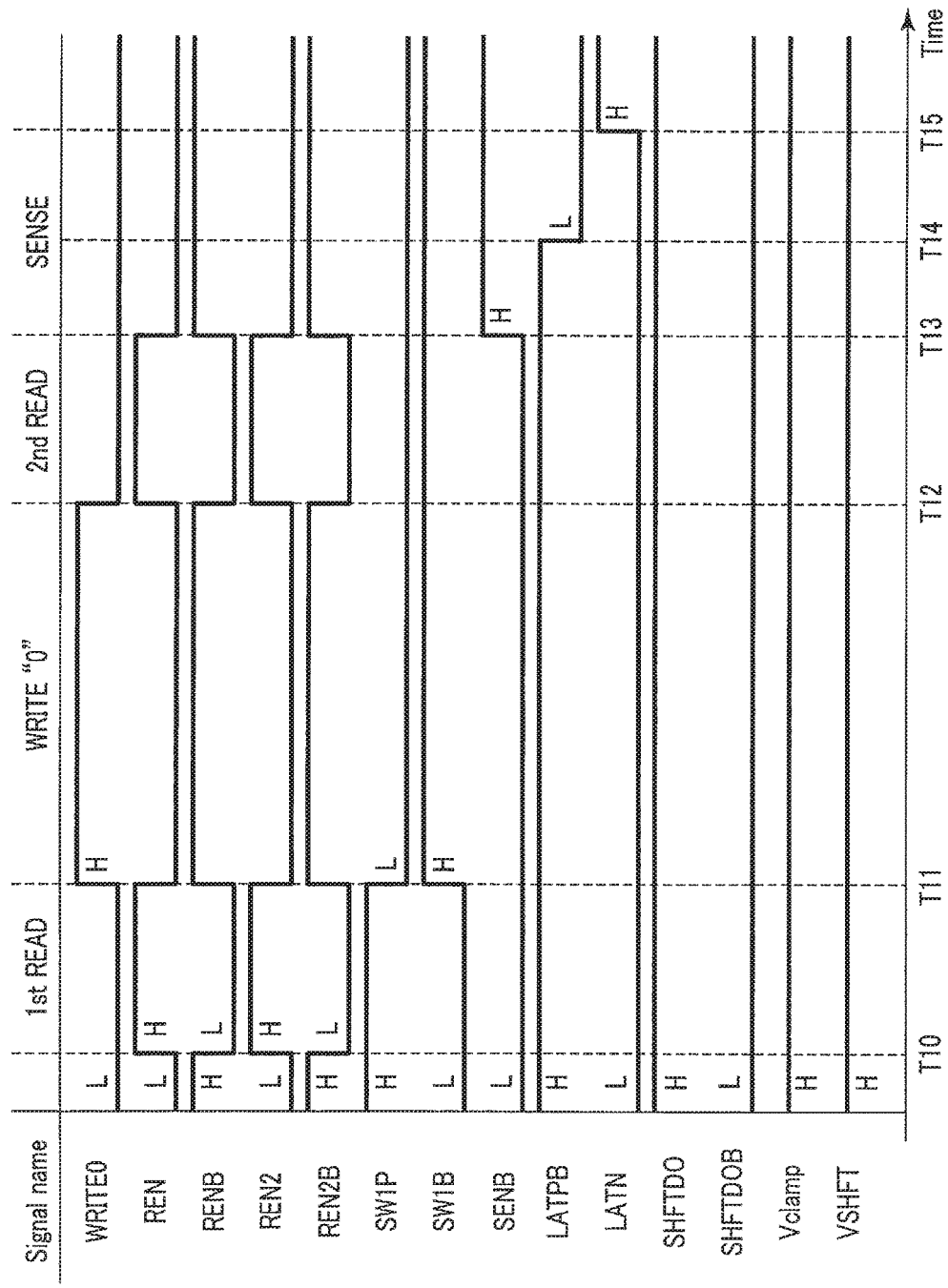
FIG. 29 is a timing chart of the read operation of a memory system according to the fourth embodiment.

Details of the read operation of the memory system according to the fourth embodiment will be described with reference to the timing chart of FIG. 29. A case in which the preamplifier described in the second embodiment applied will be described here.

[Time T10] to [Time T13]

A memory device 10 performs the same operation as in the times T0 to T3 described in the second embodiment with reference to FIG. 22.

[Time T13] to [Time T15]

In the determination operation (step S1004), a controller 17 lowers a signal REN and a signal REN2 to "L" level, and raises a signal RENB, a signal REN2B, and a signal SENB to "H" level. The controller 17 also sets a signal SHFTDO, a signal VSHFT, and a signal LATPB to "H" level, and sets a signal SHFTDOB and a signal LATN to "L" level.

Accordingly, transistors M5 and M9 of the preamplifier 110 change to the OFF (nonconductive) state. A node N4 thus stores voltage information (signal voltage) V2nd.

A sense amplifier 120 operates as described with reference to FIG. 26.

[Time T15]

When the determination operation (step S1004) ends, the controller 17 raises the signal LATN to "H" level. A transistor M34 of the sense amplifier 120 is thus turned on. Accordingly, a signal DO and a signal DOB are reset.

Note that in the above-described embodiment, the operation of writing "0" to the memory cell as the target of the first read operation by the memory device 10 in step S1002 has been described. However, the memory device 10 may write "1" to the memory cell as the target of the first read operation in step S1002. That is, "1" may be the standard state.

Figure 30:
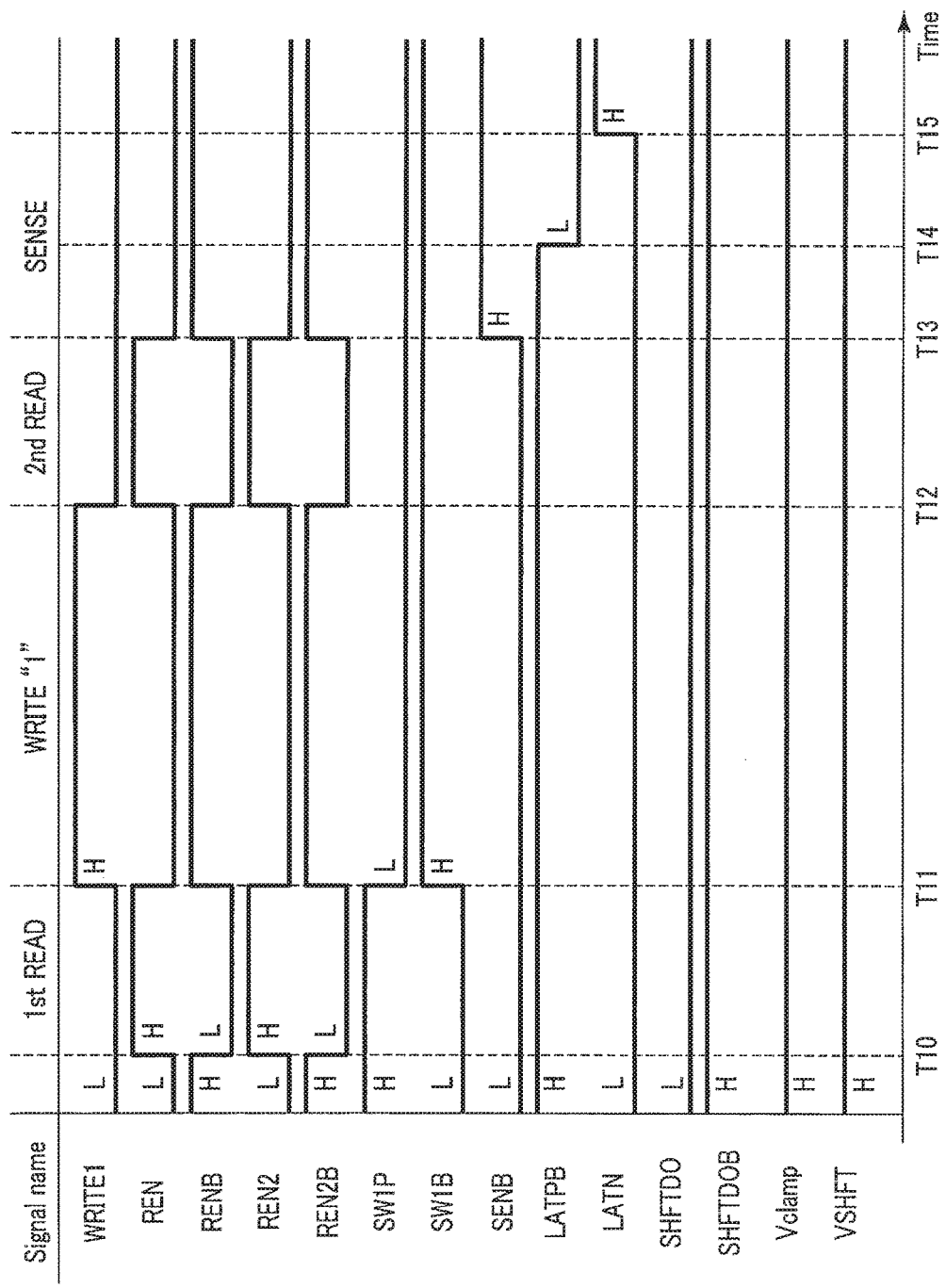
FIG. 30 is a timing chart of the read operation of the memory system according to the fourth embodiment.

Note that when writing "1" in step S1002, the controller 17 sets the signal SHFTDO to "L" level, and sets the signal SHFTDOB to "H" level in the read operation (see FIG. 30). Accordingly, I2nd+Ishift is supplied to a node N19, and I1st is supplied to a node N18 in the determination operation (step S1004) (see FIG. 28). The determination operation can thus be performed.

<4-2> Effects

According to the above-described embodiment, the same effects as in the first embodiment can be obtained.

<5> Others

Note that the term "connect" in the above embodiments also includes a state in which elements are indirectly connected via another element, for example, a transistor or a resistor.

An MRAM that stores data using a magnetoresistive element (Magnetic Tunnel junction (MTJ) element) as a resistance change element has been described here as an example. However, the present invention is not limited to this.

For example, the present invention is also applicable to a resistance change memory like the MRAM, for example, a semiconductor storage device such as an ReRAM or PCRAM including an element that stores data using a resistance change.

The present invention is also applicable to a semiconductor storage device, whether it is a volatile memory or a nonvolatile memory, including an element that stores data based on a resistance change caused by application of a current or a voltage or reads stored data by converting a resistance difference generated by a resistance change into a current difference or a voltage difference.

In the above-described embodiments, the bit line pair has been referred to as the bit line BL and the source line SL for the descriptive convenience. However, the present invention is not limited to this. For example, the bit line pair may be referred to as a first bit line and a second bit line.

In the above-described embodiments, in the memory system 1, one memory device 10 is connected to the memory controller 20. However, the present invention is not limited to this. For example, the memory system 1 may have an arrangement in which a plurality of memory devices 10 are connected to the memory controller 20.

While certain embodiments have been described, these embodiments have been presented by way of example only, and are not intended to limit the scope of the inventions.

Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A memory device comprising:
a memory cell; and
a first circuit configured to:
perform a first read for the memory cell and generate a first voltage,
write first data to the memory cell that has undergone the first read,
perform a second read for the memory cell to which the first data is written and generate a second voltage, and
determine data stored in the memory cell at the time of the first read based on the first voltage and the second voltage,
wherein when writing the first data, the first circuit electrically sets a generation unit configured to generate the second voltage to a floating state,
wherein the generation unit is sandwiched by two transistors, and the second voltage varies as a result of the second read and control signals provided to the two transistors.

2. The device of claim 1, wherein the first circuit comprises:
a preamplifier configured to generate the first voltage and the second voltage; and
a sense amplifier configured to determine the data stored in the memory cell at the time of the first read based on the first voltage and the second voltage.

3. The device of claim 2, wherein:
when performing the first read for the memory cell, the preamplifier supplies a first current to the memory cell via a first path, and supplies a second current that is a copy current of the first current to a first voltage generation unit configured to generate the first voltage and a second voltage generation unit configured to generate the second voltage via a second path electrically separated from the first path, and
when performing the second read for the memory cell, the preamplifier supplies a third current to the memory cell via the first path, and supplies a fourth current that is a copy current of the third current to the second voltage generation unit via the second path.

4. The device of claim 3, wherein:
when performing the first read for the memory cell, the preamplifier supplies the first current to the memory cell via the first path using a first diode-connected transistor, and
when performing the second read for the memory cell, the preamplifier supplies the third current to the memory cell via the first path using the first diode-connected transistor.

5. The device of claim 4, wherein:
when performing the first read for the memory cell, the preamplifier supplies the second current to the first voltage generation unit via the second path using a second diode-connected transistor, and
when performing the second read for the memory cell, the preamplifier supplies the fourth current to the second voltage generation unit via the second path using the second diode-connected transistor.

6. The device of claim 3, wherein:
when performing the first read for the memory cell, the preamplifier supplies the second current to the first voltage generation unit and the second voltage generation unit using a first current supply unit,
when writing the first data, the preamplifier electrically sets the first voltage generation unit and the second voltage generation unit in the floating state using the first current supply unit, and
when performing the second read for the memory cell, the preamplifier supplies the fourth current to the second voltage generation unit using the first current supply unit.

7. The device of claim 6, wherein:
when performing the first read for the memory cell, the preamplifier discharges the first voltage generation unit and the second voltage generation unit using a second current supply unit,
when writing the first data, the preamplifier electrically sets the first voltage generation unit and the second voltage generation unit in the floating state using the second current supply unit, and
when performing the second read for the memory cell, the preamplifier discharges the second voltage generation unit using the second current supply unit.

8. The device of claim 7, wherein:
when performing the first read for the memory cell, the preamplifier supplies the first current to the memory cell using a third current supply unit, and
when performing the second read for the memory cell, the preamplifier supplies the third current to the memory cell using the third current supply unit.

9. The device of claim 8, wherein the second current supply unit and the third current supply unit operate based on a first control signal, and the first current supply unit operates based on a second signal that is an inverted signal of the first control signal.

10. The device of claim 8, wherein the third current supply unit operates based on a first control signal, the second current supply unit operates based on a second control signal, and the first current supply unit operates based on a third signal that is an inverted signal of the second control signal.

11. A method of controlling a memory device, the method comprising:
performing a first read for a memory cell and generating a first voltage;
writing first data to the memory cell that has undergone the first read in a state in which a generation unit configured to generate a second voltage is electrically set to a floating state;
providing control signals to two transistors sandwiching the generation unit;
performing a second read for the memory cell to which the first data is written and generating the second voltage based on a result of the second read and the control signals; and
determining data stored in the memory cell at the time of the first read based on the first voltage and the second voltage.

12. The method of claim 11, wherein:
when performing the first read for the memory cell, a first current is supplied to the memory cell via a first path, and a second current that is a copy current of the first current is supplied to a first voltage generation unit configured to generate the first voltage and a second voltage generation unit configured to generate the second voltage via a second path electrically separated from the first path, and when performing the second read for the memory cell, a third current is supplied to the memory cell via the first path, and a fourth current that is a copy current of the third current is supplied to the second voltage generation unit via the second path.

13. The method of claim 12, wherein:
when performing the first read for the memory cell, the first current is supplied to the memory cell via the first path using a first diode-connected transistor, and
when performing the second read for the memory cell, the third current is supplied to the memory cell via the first path using the first diode-connected transistor.

14. The method of claim 13, wherein:
when performing the first read for the memory cell, the second current is supplied to the first voltage generation unit via the second path using a second diode-connected transistor, and
when performing the second read for the memory cell, the fourth current is supplied to the second voltage generation unit via the second path using the second diode-connected transistor.

15. The method of claim 12, wherein:
when performing the first read for the memory cell, the second current is supplied to the first voltage generation unit and the second voltage generation unit using a first current supply unit,
when writing the first data, the first voltage generation unit and the second voltage generation unit are electrically set in the floating state using the first current supply unit, and
when performing the second read for the memory cell, the fourth current is supplied to the second voltage generation unit using the first current supply unit.

16. The method of claim 15, wherein:
when performing the first read for the memory cell, the first voltage generation unit and the second voltage generation unit are discharged using a second current supply unit,
when writing the first data, the first voltage generation unit and the second voltage generation unit are electrically set in the floating state using the second current supply unit, and
when performing the second read for the memory cell, the second voltage generation unit is discharged using the second current supply unit.

17. The method of claim 16, wherein:
when performing the first read for the memory cell, the first current is supplied to the memory cell using a third current supply unit, and
when performing the second read for the memory cell, the third current is supplied to the memory cell using the third current supply unit.

18. The method of claim 17, wherein the second current supply unit and the third current supply unit operate based on a first control signal, and the first current supply unit operates based on a second signal that is an inverted signal of the first control signal.

19. The method of claim 17, wherein the third current supply unit operates based on a first control signal, the second current supply unit operates based on a second control signal, and the first current supply unit operates based on a third signal that is an inverted signal of the second control signal.

20. A memory device comprising:
a memory cell that stores data based on a high resistance state and a low resistance state;
a preamplifier comprising:
a first transistor and a second transistor connected to each other, the first and second transistors forming a current mirror, and one end of the first transistor being connected to a first voltage terminal,
a read enable transistor having one end connected to another end of the first transistor, another end connected to the memory cell, and a gate provided with a read enable signal,
a first voltage hold transistor having one end connected to the first voltage terminal, another end connected to one end of the second transistor, and a gate provided with the read enable signal,
a first node connected to a capacitor,
a second node connected to another end of the second transistor,
a connection switch having one end connected to the first node and another end connected to the second node,
a sink transistor having one end connected to the second node (N4) and a gate connected to the second node, and
a second voltage hold transistor having one end connected to another end of the sink transistor, another end connected to a second voltage terminal, and a gate provided with the read enable signal;
a sense amplifier connected to the first node and the second node, and configured to determine the data stored in the memory cell by comparing a first voltage at the first node and a second voltage at the second node; and
a controller configured to:
perform a first read operation to read the data from the memory cell while turning on the read enable transistor, the first voltage hold transistor and the second voltage hold transistor and activating the switch, to thereby charge a first voltage at the first node,
perform a reference write operation to write reference data into the memory cell while turning off the read enable transistor, the first voltage hold transistor and the second voltage hold transistor and deactivating the switch, to thereby maintain the first voltage charged at the first node,
perform a second read operation to read the reference data from the memory cell while turning on the read enable transistor, the first voltage hold transistor and the second voltage hold transistor and activating the switch, to thereby charge a second voltage at the second node, and
cause the sense amplifier to determine the data having been stored in the memory cell at a time of the first read operation by comparing the first voltage at the first node and the second voltage at the second node.

21. The device of claim 20, wherein:
the read enable signal includes:
a first read enable signal; and
a second read enable signal having an inverted logical value of the first read enable signal,
the read enable transistor is an N-type MOS transistor, and the first read enable signal is provided to the gate thereof,
the first voltage hold transistor is a P-type MOS transistor, and the second read enable signal is provided to the gate thereof, and the second voltage hold transistor is a P-type MOS transistor, and the first read enable signal is provided to the gate thereof.

22. The device of claim 20, wherein:

the connection switch is a transfer gate having an N-type MOS transistor and a P-type MOS transistor.

23. The device of claim 20, wherein:

the preamplifier further includes a voltage clamp transistor connected between the another end of the first transistor and the one end of the first voltage hold transistor.

\* \* \* \* \*